United States Patent
Bajwa

(10) Patent No.: US 6,487,694 B1
(45) Date of Patent: Nov. 26, 2002

(54) METHOD AND APPARATUS FOR TURBO-CODE DECODING A CONVOLUTION ENCODED DATA FRAME USING SYMBOL-BY-SYMBOL TRACEBACK AND HR-SOVA

(75) Inventor: Raminder Singh Bajwa, Palo Alto, CA (US)

(73) Assignee: Hitachi America, Ltd., Tarrytown, NY (US)

(*) Notice: Subject to any disclaimer, the term of this patent is extended or adjusted under 35 U.S.C. 154(b) by 0 days.

(21) Appl. No.: 09/467,732

(22) Filed: Dec. 20, 1999

(51) Int. Cl.$^7$ .................... H03M 13/29; H03M 13/41
(52) U.S. Cl. .................... 714/786; 714/795; 714/796
(58) Field of Search .................... 714/755, 794, 714/795, 786

(56) References Cited

U.S. PATENT DOCUMENTS

| | | | |
|---|---|---|---|
| 5,181,209 A | 1/1993 | Hagenauer et al. | 371/43 |
| 5,729,560 A | 3/1998 | Hagenauer et al. | 371/43.1 |
| 5,933,462 A * | 8/1999 | Viterbi et al. | 375/262 |
| 6,189,126 B1 * | 2/2001 | Ulmer et al. | 714/794 |

OTHER PUBLICATIONS

Jung, "Comparison of Turbo–Code Decoders Applied to Short Frame Transmission Systems", IEEE Journal on Selected Areas in Communications, vol. 14, No. 3, Apr. 1996, pp. 530–537.*

Papke et al., "Improved Decoding with the SOVA in a Parallel Concatenated (Turbo–code) Scheme", ICC '96, Jun. 1996, pp. 102–106.*

Viterbi, "Approaching the Shannon Limit: Theorist's Dream and Practitioner's Challenge", Second European Workshop on Mobile/Personal Satcoms, Oct. 1996, pp. 1–11.*

Lin et al., "Improvements in SOVA–Based Decoding for Turbo Codes", ICC '97, Jun. 1997, pp. 1473–1478.*

Viterbi, "An Intuitive Justification and a Simplified Implementation of the MAP Decoder for Convolutional Codes", IEEE Journal on Selected Areas in Communications, vol. 16, No. 2, Feb. 1998, pp. 260–264.*

(List continued on next page.)

*Primary Examiner*—Stephen M. Baker
(74) *Attorney, Agent, or Firm*—R. Michael Ananian; Dorsey & Whitney LLP

(57) ABSTRACT

The apparatus includes a first SOVA decoder that generates a first path reliability value from a channel value, a parity symbol and a first a priori likelihood value. A first decorrelation unit generates a first extrinsic symbol reliability value by decorrelating the channel value and the first a priori likelihood value from the path reliability value. A first symbol reliability saturation unit saturates the first extrinsic symbol reliability value to generate a first saturated extrinsic symbol reliability value. A first interleaver interleaves the first saturated extrinsic symbol reliability value to generate a second a priori likelihood value. A second interleaver interleaves the channel value to generate an interleaved channel value. A second SOVA decoder generates a second path reliability value from an interleaved parity symbol, the second a priori likelihood value, and the interleaved channel value. A second decorrelation unit generates a second extrinsic symbol reliability value by decorrelating the interleaved channel value and the second a priori likelihood value from the second path reliability value. A second symbol reliability saturation unit saturates the second extrinsic symbol reliability value to generate a second saturated extrinsic symbol reliability value. A first de-interleaver de-interleaves the second saturated extrinsic symbol reliability value to generate the first a priori likelihood value. A second de-interleaver de-interleaves the second extrinsic symbol reliability value to generate a decoded message. Additionally, the path reliability value are saturated. Advantages include simplified hardware implementations having improved BER characteristics and faster convergence, requiring fewer decoding iterations to generate a result.

17 Claims, 12 Drawing Sheets

OTHER PUBLICATIONS

Garrett et al., "Low Power Architecture of the Soft–Output Viterbi Algorithm", 1998 International Symposium on Low Power Electronics and Design, Aug. 1998, pp. 262–267.*

Hong et al., "VLSI Design and Implementation of Low–Complexity Adaptive Turbo–Code Encoder and Decoder for Wireless Mobile Communication Applications", SIPS '98, Oct. 1998, pp. 233–242.*

Kwon et al., "A Modified Two–Step SOVA–Based Turbo Decoder for Low Power and High Performance", TENCON 99, Sep. 1999, pp. 297–300.*

Masera et al., "VLSI Architecture for Turbo Codes", IEEE Transactions on Very Large Scale Integration (VLSI) Systems, vol. 7, No. 3, Sep. 1999, pp. 369–379.*

* cited by examiner

METHOD AND APPARATUS FOR TURBO-CODE DECODING A CONVOLUTION ENCODED DATA FRAME USING SYMBOL-BY-SYMBOL TRACEBACK AND HR-SOVA

The present invention relates generally to a turbo-code decoding apparatus and method. In particular, the invention relates to an improved turbo-code decoding apparatus and method for decoding a convolution encoded data frame using symbol-by-symbol trace back and an approximation into HR-SOVA to improve bit error rate (BER) performance with fewer iterations.

BACKGROUND OF THE INVENTION

In 1948 Shannon published a paper entitled "A Mathematical Theory of Communication" in the *Bell System Technical Journal*, Vol. 27, pp. 379–423 and pp. 623–656, 1948. Shannon showed that the system capacity, C, of a channel perturbed by additive white Gaussian noise power (AWGN) is a function of the average received signal power, S, the average noise power, N, and the bandwidth, W. The system capacity is given by the following formula:

$$C = W \log_2(1 + S/N)$$

This equation promises the existence of error correction codes that enable information transmission over a noisy channel at any rate, R, where $R \leq C$, with an arbitrarily small error probability. Shannon's work showed that the values of S, N, and W, set a limit on the transmission rate, not on the error probability.

In a subsequent paper entitled "Communication Theory of Secrecy Systems," *Bell System Technical Journal*, Vol. 28, pp. 656–715, 1949, Shannon showed that the maximum amount of information that can be transmitted over a noisy channel is limited by the following formula, known as the Shannon limit:

$$E_b/N_0 = W/C(2^{C/W} - 1) = -1.59 \text{ db}$$

where $E_b$ represents the bit energy of the transmitted information bits; $N_0$ represents a proportionality constant of the noise power N, such that $N_0 = N/W$; and $E_b/N_0$ is the signal to noise ratio.

Shannon's work established the benchmark by which the performance of all error control coding techniques, in terms of bit error rate (BER), are measured. However, it was not until the discovery of a new class of convolution codes that the BER of an error control coding technique came close to the Shannon limit. In the paper C. Berror, A. Glavieux, and P. Thitimajshima, "Near the Shannon Limit Error-Correcting Coding and Decoding: Turbo-Codes(1)," in *Proc., IEEE Int. Conf. on Communications* (Geneva, Switzerland, May 1993), p. 1064–1070, such a Turbo-Code encoder is described. The Turbo Code encoder, built using a parallel concatenation of two Recursive Systematic Convolution Codes (RSC) and the associated decoder, using a feedback decoding rule, is implemented as P pipelined identical elementary decoders. Simulation results of the Turbo-Code decoder achieved a $E_b/N_0 = 0.7$ dB. However the hardware implementation of the decoder required a huge interleaver of 64,500 bits, 18 iterations to decode each symbol, and some ad hoc fine tuning factors of the updating rule.

In Joachim Hagenauer, Elke Offer, and Lutz Papke, "Iterative Decoding of Binary Block and Convolutional Codes," *IEEE Trans. on Information Theory*, 42(2): 429–445, 1996, (Hagenauer et al) a decoder is described that accepts soft inputs—including a priori values—and delivers soft outputs that can be split into three terms: the soft channel, and a priori inputs, and the extrinsic value. The extrinsic value is used as an a priori value for the next iteration. The iterations are controlled by a stop criterion derived from cross entropy, which results in a minimal number of iterations. The decoder applies a soft output Viterbi algorithm (SOVA) to decode turbo codes. SOVA modifies the conventional Viterbi algorithm to generate soft decisions, rather than hard decisions (0/1), based on the updating rule described in Hagenauer et al. Details regarding the Viterbi algorithm are described in "Error control systems for digital communication and storage" by Stephen B. Wicker published 1995 by Prentice Hall, Inc., Englewood Cliffs, N.J. 07632, ISBN 0-13-200 809-2.

Hagenauer's updating rule (typically called the HR rule) is a low complexity approximation algorithm for turbo decoding. Its lower complexity makes it suitable for hardware implementation. However the HR rule still requires significant resources of memory when an entire block or frame of data has to be processed with a single traceback step. In addition, an HR-SOVA decoder using the HR rule is sub-optimal due to the fact that the a priori or confidence value grows very rapidly (too rapidly) following each iteration. The HR rule erroneously overestimates the confidence value and thereby eliminates the opportunities to recognize and correct bit errors.

In Lang Lin and Roger S. Cheng, "Improvements in SOVA-Based Decoding for Turbo Codes," In *Proceedings of the ICC*, 1997 (Lang et al), the authors proposed a modification to the HR-SOVA decoder to thereby limit the reliability/confidence values to a small range to compensate for the defect brought by overestimating those values in the original SOVA. However, it is unclear whether this fixed saturation technique creates an upper bound for an extrinsic likelihood value generated from the modified confidence values.

SUMMARY

What is needed is an improved Turbo-code decoder that results in Bit Error Rate (BER) performance comparable to full-length traceback BER performance even when using small, fixed-length traceback (symbol-by-symbol traceback). A need also exists for a Turbo-code decoder that results in a steeper convergence in the initial few iterations, thereby allowing the use of fewer iterations for the same BER performance. Consequently, the use of fewer iterations reduces the time required for computing a result. A need also exists for a Turbo-code decoder that results in lower power consumption or can allow higher data rates to be processed at the same clock speeds when compared to fixed-saturation or non-saturation techniques. The technique must be robust enough to sustain a loss of the least significant bit (LSB) of the likelihood values without deterioration in BER performance to reduces storage requirements.

The present invention overcomes the problems associated with the prior art systems by disclosing a method and apparatus that (a) improves the Bit Error Rate (BER) performance of a priori SOVA (APRI-SOVA) based on the updating rule as described in Hagenauer et al (henceforth referred to as HR-SOVA); (b) does so in fewer iterations, hence impacting favorably on computational requirements; and (c) remains very suited for hardware implementation. The present invention introduces an approximation into delta and likelihood values produced by a decoder utilizing the HR-SOVA algorithm in the form of two new saturation algorithms resulting in an improved Turbo code decoder.

One embodiment of the present invention is an apparatus which includes a first SOVA decoder that generates a first path reliability value from a channel value and a parity symbol of the encoded frame, and a first a priori likelihood value. A first decorrelation unit then generates a first extrinsic symbol reliability value by decorrelating the channel value and the first a priori likelihood value from the first path reliability value. A first symbol reliability saturation unit saturates the first extrinsic symbol reliability value to generate a first saturated extrinsic symbol reliability value. A first interleaver interleaves the first saturated extrinsic symbol reliability value to generate a second a priori likelihood value for a second stage of the decoder. A second interleaver interleaves the channel value to generate an interleaved channel value for the second stage of the decoder. A second SOVA decoder then generates a second path reliability value from an interleaved parity symbol of the encoded frame, the second a priori likelihood value, and the interleaved channel value. A second decorrelation unit generates a second extrinsic symbol reliability value by decorrelating the interleaved channel value and the second a priori likelihood value from the second path reliability value. A second symbol reliability saturation unit saturates the second extrinsic symbol reliability value to generate a second saturated extrinsic symbol reliability value. A first de-interleaver de-interleaves the second saturated extrinsic symbol reliability value to generate the first a priori likelihood value as an input to the first SOVA decoder. The decoder is completed by a second de-interleaver that de-interleaves the second extrinsic symbol reliability value to generate a decoded message of the convolution encoded data frame.

In a further embodiment, the apparatus further includes a first path reliability saturation unit that saturates the first path reliability value received from the first SOVA decoder to generate a first saturated path reliability value as an input to the first decorrelation unit. A second path reliability saturation unit saturates the second path reliability value received from the second SOVA decoder to generate a second saturated path reliability value as an input to the second decorrelation unit and the second de-interleaver. Moreover, the saturation technique of the present invention is sufficiently robust to sustain the loss of the LSB of the first and second a priori likelihood values in the interleaver memories.

Advantages of the invention include ease of hardware implementation. Moreover, hardware implementations employing the saturation technique of the present invention benefit by having improved BER characteristics. Furthermore this saturation technique results in faster convergence, thereby requiring fewer decoding iterations to generate a result as compared to fixed-saturation techniques and non-saturating techniques. This can help reduce the power consumption or handle higher data rates as necessary. Compared to non-saturating schemes, the saturation technique of the present invention requires a smaller word size for the first and second extrinsic symbol reliability values, resulting in a reduced memory sizes for the interleaver memories.

BRIEF DESCRIPTION OF THE DRAWINGS

Additional advantages and features of the invention will become readily apparent upon reading the following detailed description and appended claims when taken in conjunction with reference to the drawings, in which:

DETAILED DESCRIPTION

The present invention describes an apparatus and a method that (a) improves the Bit Error Rate (BER) performance of a priori soft output Viterbi algorithm (SOVA) (APRI-SOVA) based on an updating rule as described in Hagenauer et al (henceforth referred to as HR-SOVA); (b) does so in fewer iterations hence impacting favorably on computational requirements; and (c) remains very suited for hardware implementation. The technique is very general in its applicability and improves the BER performance of an HR-SOVA decoder and hence also Turbo-code decoders based on HR-SOVA. Its applicability is independent of the constituent codes and puncturing techniques employed.

Figure 1:
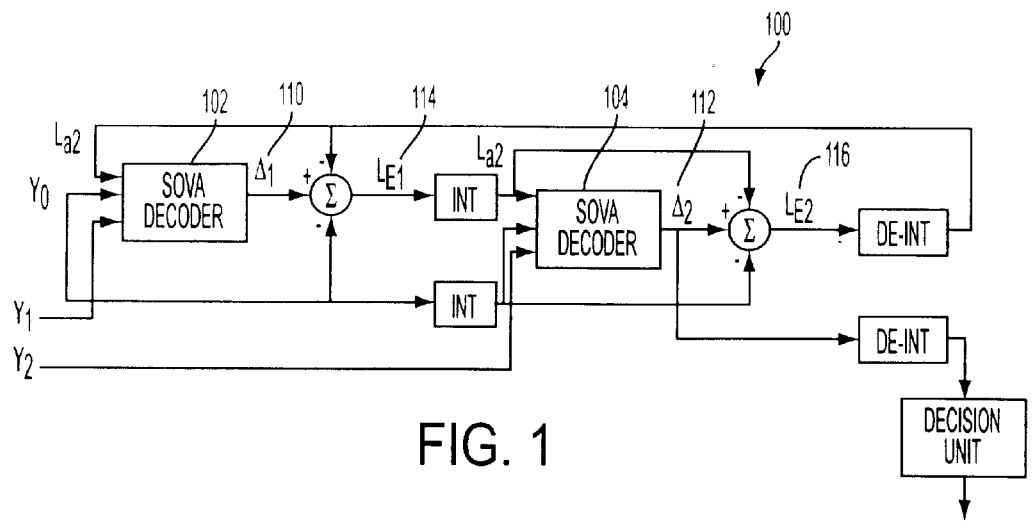
FIG. 1 depicts a TURBO-code decoder as known in the art.

FIG. 1 depicts a block diagram of a Turbo decoder 100 as known in the art. Turbo decoder configuration 100 utilizes a pair of SOVA decoders 102 and 104 based on an HR-SOVA implementation. The relevant features of the Turbo-code decoder 100 implementation and modifications thereof are described in the System Architecture section, below. The derivation of the HR-SOVA algorithm is provided in Hagenauer et al. For the purposes of this implementation and keeping in accordance with the derivation provided in Hagenauer et al, logic 0 is mapped onto "+1" and logic 1 is mapped onto "−1". But this is just a convention and one can swap this mapping and derive an equivalent result. The main features of the algorithm are now described; for more detail please refer to Hagenauer et al.

Figure 4:
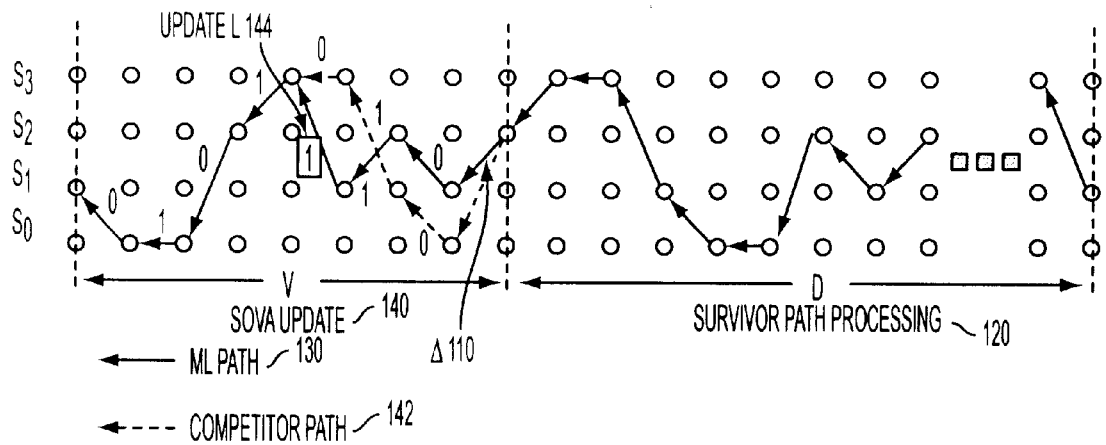
FIG. 4 depicts processing of a trellis diagram during the symbol-by-symbol traceback as taught by the present invention.

The algorithm is based on the Viterbi algorithm which is a dynamic programming solution to finding the least cost path between two nodes of a graph. The graph in question here is a special graph and is the trellis diagram corresponding to the convolution code used, for example as depicted in FIG. 4. The trellis branches or, equivalently, the edges of the graph are weighted based on the difference between received data and an ideal value derived from the convolution codeword for the branch. Euclidean distance is used as the difference metric. In addition to the Euclidean distance the branch metric also includes a likelihood term. The resultant branch metric term is used in computing the path metrics as we advance through the trellis diagram during a first phase of the algorithm, generally referred to as survivor path processing 120 of the trellis diagram as depicted in FIG. 4.

The path metrics, which represent a measure of the likelihood of the paths, are computed as prescribed by equation 48 in Hagenauer et al. The path metric computation for the $i^{th}$ path is reproduced below, $$M_k(s^{(i)}) = M_{k-1}(s'^{(i)}) + \frac{1}{2}L_c y_{k,1} u_k^{(i)} + \frac{1}{2}L_E(u_k) u_i^{(i)} + \frac{1}{2}\sum_{v=2}^{n} L_c y_{k,v} x_{k,v}^{(i)}$$

where $M_k(s^{(i)})$ is the path metric at level k of the trellis diagram at state $s^{(i)}$. The rest of the terms constitute the branch metric. $y_{k,1}$ represents the received value of the information bit. $L_E(u_k)$ is the a priori likelihood value corresponding to the information bit, $y_{k,1}$, received from the channel. $u_k^{(i)}$ and $x_{k,v}^{(i)}$ represent the information and parity bits (i.e. the ideal value from the codeword for this branch or edge) which act as weights for the corresponding branch of the encoder trellis. The information and parity bits, $y_{k,1}$ and $y_{k,v}$s, received from the channel are 4-bit quantities, whereas $u_k^{(i)}$ and $x_{k,v}^{(i)}$s take values from $\{+1, -1\}$. $L_c$ is the channel reliability, such that $L_c y_{k,1}$ and $L_c y_{k,v}$ are the received channel values. So, instead of a hard value of "0" or "1", the interval separating a logical "0" from a logical "1" in the analog domain is quantized and the quantized intervals are represented, for example, by 4-bit quantities. These 4-bit quantities are mapped onto 5-bit odd values to create a symmetric distribution.

Once the survivor path processing is complete, the reliability values of the survivor path must be updated to generate a maximum likelihood (ML) path 130 by traversing the trellis diagram in the opposite direction. During this trellis update 140, when a selection is made between two incoming paths at a state at level k, Hagenauer and his colleagues observed that the likelihood or confidence in the choice can be based on how close one comes to selecting the other path. This measure or path reliability value is denoted Δ110 and it is computed as follows:

$$\Delta = M_k(s^{(i)}) - M_k(s^{(i')}) \geq 0$$

where $s^{(i)}$ and $s^{(i')}$ represent the state at time k where paths i and i' meet. In order to perform the trellis update 140, the survivor path is traversed in the opposite direction in order to generate the competing or competitor paths 142. However, there are several techniques for determining the depth of the survivor path and the reverse depth for the trellis update along the trellis diagram to generate the ML path 130 and generate output path reliability values Δ 110.

Figure 2:
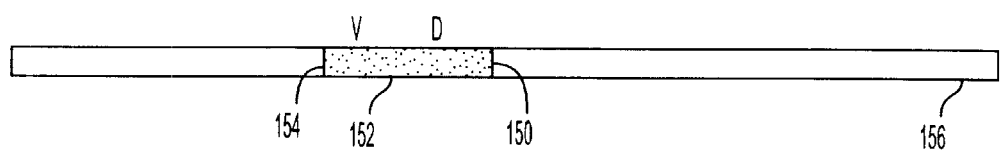
FIG. 2 depicts processing a frame segment and associated processing boundaries as taught by the present invention.

One strategy for determining the depth of the survivor path and the reverse depth for the trellis update along the trellis diagram is symbol-by-symbol traceback. In a symbol-by-symbol traceback, a segment of the frame is processed at a time. The segment advances from the beginning of the frame to the end in an overlapping or sliding manner by a symbol at a time. The implementation can be partitioned into five processing stages for ease of understanding. The segment of the frame being processed has two distinct parts. Three distinct boundaries are indicated and labeled in this segment and shown in FIG. 2. They are, the point where survivor path processing begins 150, the point where it ends and SOVA update begins 152, and finally the point where the soft output is generated 154. FIG. 3 attempts to illustrate how the implementation processes a frame 156. The arrows indicate the advance of the associated boundary during that stage of processing. Note that during the start and end of the frame 156 not all boundaries advance. The manner in which we do the operations at the frame's end can affect BER performance.

Figure 3A:
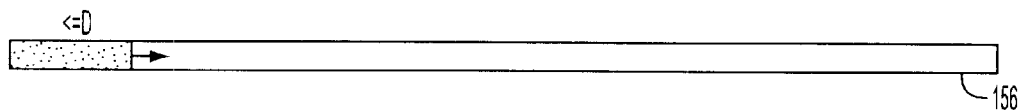
FIGS. 3A–3E depicts the processing a data frame using symbol-by-symbol traceback as taught by the present invention.

1. Initially, we have to advance a minimum number of levels along the trellis diagram in order to be able to begin a trace-back. This constitutes the first stage where the trellis diagram is advanced sufficiently to be able to do survivor path processing 120. This process is depicted in FIG. 3a.

Figure 3B:
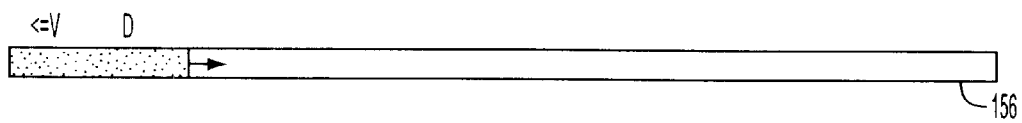

2. Having advanced a sufficient number of levels to perform survivor path processing 120, we now need to have a sufficient number of levels to perform the SOVA update 140. During this, the second stage, we continue advancing the trellis diagram, continue advancing the SOVA update boundary 152 as well as performing SOVA updates until the beginning of the frame 156, but no output is generated yet. This process is depicted in FIG. 3b.

Figure 3C:
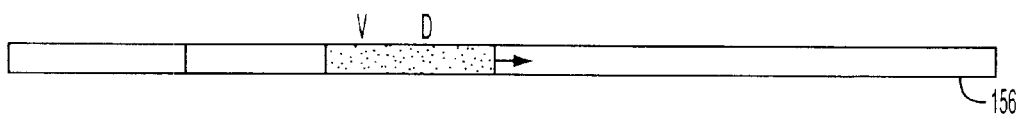

3. The third stage constitutes the bulk of the processing cycles and it constitutes the phase when all three boundaries are advanced and output is generated. This process is depicted in FIG. 3c.

Figure 3D:

4. The fourth stage begins when the forward processing reaches the end of the frame 156 and we now have to flush what is in the pipeline. In this stage the survivor path processing 120 distance, D, is allowed to shrink down to zero. The SOVA update process continues unchanged. This process is depicted in FIG. 3d.

Figure 3E:
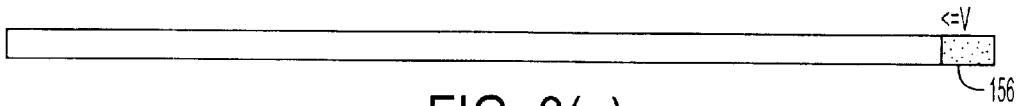

5. The fifth and final stage occurs when only V levels of the trellis diagram remain. As no more SOVA updated need be performed, the Δ values 110 along the ML path 130 are emitted. This is depicted in FIG. 3e.

FIG. 4 depicts the SOVA update 140 utilizing symbol-by-symbol traceback of the present invention which is based on a version described in Olaf J. Joeressen and Heinrich Meyr, "A 40 MBit/s Soft Output Viterbi Decoding ASIC" In *Proceedings of the ICC*, 1994 (Joeressen et al), which performs incremental updates of the Δ values, and in a cumulative manner achieves the same result. In contrast, the description of SOVA update in Hagenauer et al is computationally inefficient as it requires multiple passes over competitor paths hanging off of the ML path 130. Practical constraints imply that we must employ a trace-back much smaller than the frame size at the cost of some BER performance. After the survivor path has been determined, using a depth D traceback, the SOVA update progresses by computing the competitor path 142. If the corresponding symbols along the ML path 130 and competitor paths 142 differ, then the likelihood of the symbol along the ML path is updated by the minimum of its likelihood and Δ 110, based on the following formula:

$$\text{if } u_{ml} \neq u_c \text{ then } L(u_{ml}) = \min(\Delta, L(u_{ml})).$$

In Hagenauer et al, this constitutes the update. An example of where this update would happen 144 is indicated by the boxed 1 in FIG. 4.

Modification by the present invention to the HR-SOVA algorithm further includes the saturation of certain variables critical to the BER performance of the overall algorithm. One of these variables is the path reliability value Δ 110, which is the soft output of the SOVA decoder 102 depicted in FIG. 1. In Lang et al, the authors, citing the optimistic values of Δ resulting from using the HR-SOVA, proposed saturating Δ 110 to affixed value. However, the authors did not propose saturating the extrinsic likelihood values $L_E$ 114 and 116 derived from the Δ 110 and 112 value. The authors claim that saturating Δ 110 and 112 will automatically create an upper bound on $L_E$ 114 and 116.

Figure 5:
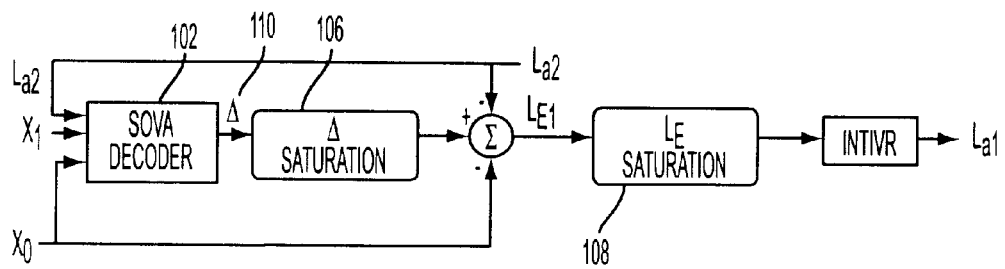
FIG. 5 depicts saturation of a first SOVA decoder as taught by the present invention.

Below we detail two modifications to saturation techniques that go beyond those described in the previous paragraph. The first proposes saturating the $L_E$ value as well. This is based on the observation that saturating the $L_E$ value results in a significant improvement in BER performance. The second modification, henceforth called variable saturation, involves using potentially different saturation values for Δ and $L_E$, such that the saturation values may also change from iteration to iteration of the decoding algorithm. FIG. 5, with reference to FIG. 1, shows where the saturation is performed from the output 110 of the first SOVA decoder 102. The saturation process is similar for the second SOVA decoder 104.

Figure 6:
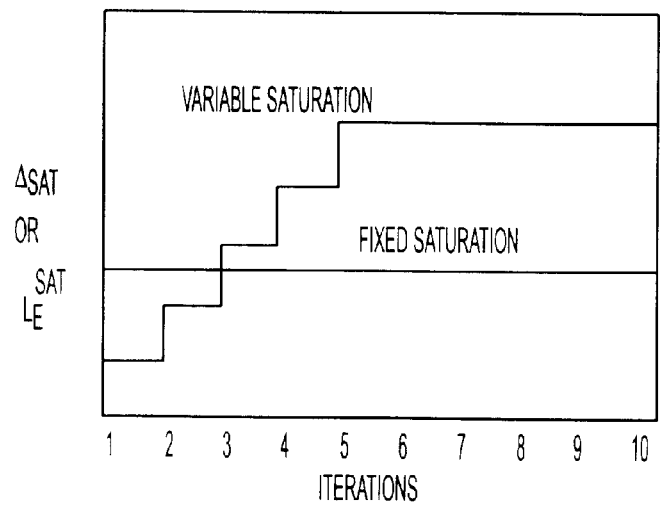
FIG. 6 graphically depicts variable saturation versus fixed saturation as taught by the present invention.
Figure 15:
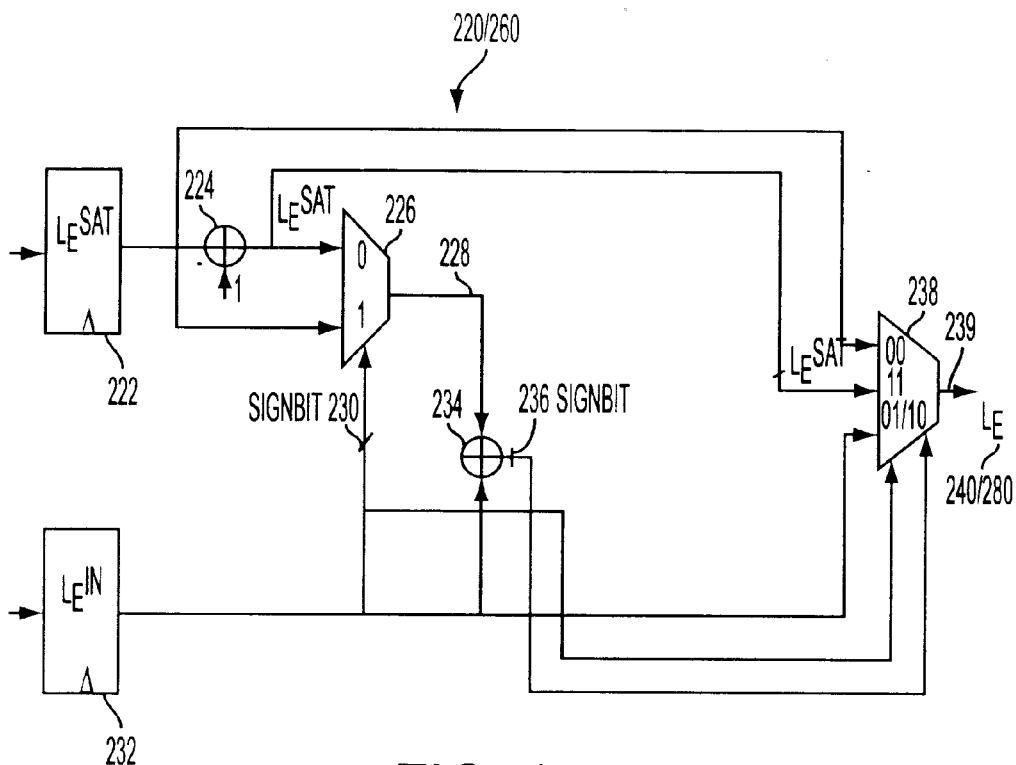
FIG. 15 depicts a path reliability saturation unit according to an exemplary embodiment of the invention.

FIG. 6 illustrates, in principle, the difference between variable saturation and fixed saturation. In fixed saturation the quantity being saturated has the same saturation value during all iterations. In the case of variable saturation it starts at some value, keeps changing every iteration and it may continue changing for all iterations or it may saturate to a final value after some number of iterations. Variable saturation may be implemented as depicted in Table 1 which shows the saturation functionality. FIG. 15 depicts how the saturation functionality is implemented. The equality signs may be moved around based on implementation specifics but the effect is captured nonetheless.

TABLE 1

Saturation of Δ

| | |
|---|---|
| $\Delta_{sat} - \Delta_{in} > 2 * \Delta_{sat}$ | $\Delta_{out} = \Delta_{sat}$ |
| $2 * \Delta_{sat} \geq \Delta_{sat} - \Delta_{in} > \Delta_{sat}$ | $\Delta_{out} = -\Delta_{in}$ |
| $\Delta_{sat} \geq \Delta_{sat} - \Delta_{in} > 0$ | $\Delta_{out} = \Delta_{in}$ |
| $0 \geq \Delta_{sat} - \Delta_{in}$ | $\Delta_{out} = \Delta_{sat}$ |

Figure 16:
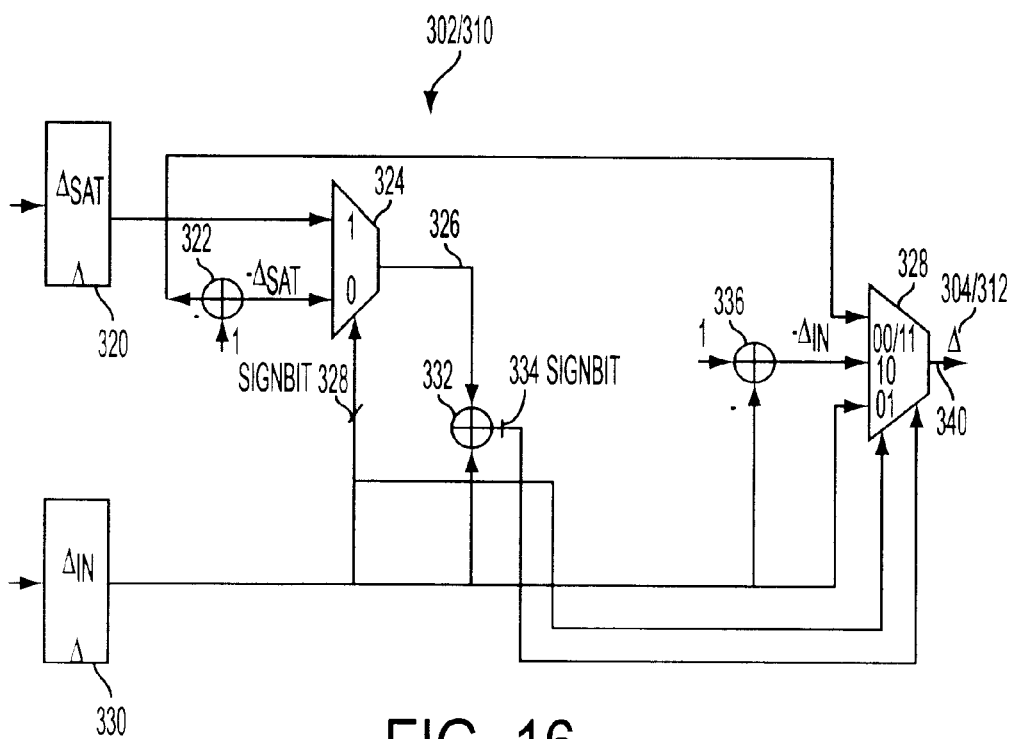
FIG. 16 depicts a symbol reliability saturation unit according to an exemplary embodiment of the invention.

Table 2 depicts additional saturation functionality. The saturation of $L_E$ is implemented in a manner similar to that of Δ and is shown in FIG. 16. $L_E$ can take on positive and negative values. Again, the equality signs may be moved around based on implementation specifics but the effect is captured nonetheless. In both cases the saturation circuitry does not lie on any critical path and hence it does not affect the speed of the design. The bit-widths are not specified as shown but depending on other design parameters these can be adapted with care taken for sign extensions.

TABLE 2

Saturation of $L_E$

| | |
|---|---|
| $L_E^{sat} - L_E^{in} > 2 * L_E^{sat}$ | $L_E^{out} = -L_E^{sat}$ |
| $2 * L_E^{sat} \geq L_E^{sat} - L_E^{in} > L_E^{sat}$ | $L_E^{out} = L_E^{in}$ |
| $L_E^{sat} \geq L_E^{sat} - L_E^{in} > 0$ | $L_E^{out} = L_E^{in}$ |
| $0 \geq L_E^{sat} - L_E^{in}$ | $L_E^{out} = L_E^{sat}$ |

With reference to FIGS. 15 and 16, the saturation values can be changed at every iteration boundary by loading in a new value into the saturation registers (labeled $L_E^{sat}/\Delta_{sat}$) or the saturation registers can be implemented as shift registers which can be shifted at iteration boundaries as necessary. Also note that the pre-loaded saturation values are assumed to be positive qualities. Further details regarding saturation units depicted in FIGS. 15 and 16 are provided below in the System Architecture section.

Figure 7:
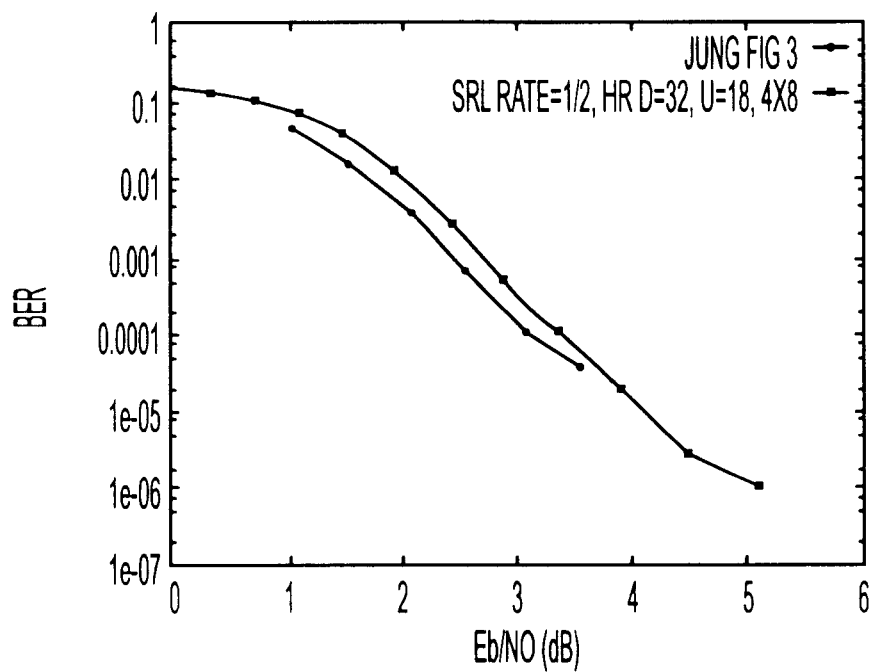
FIG. 7 graphically depicts BER performance with small saturation values for path reliability and extrinsic symbol reliability values according to the present invention.
Figure 8:
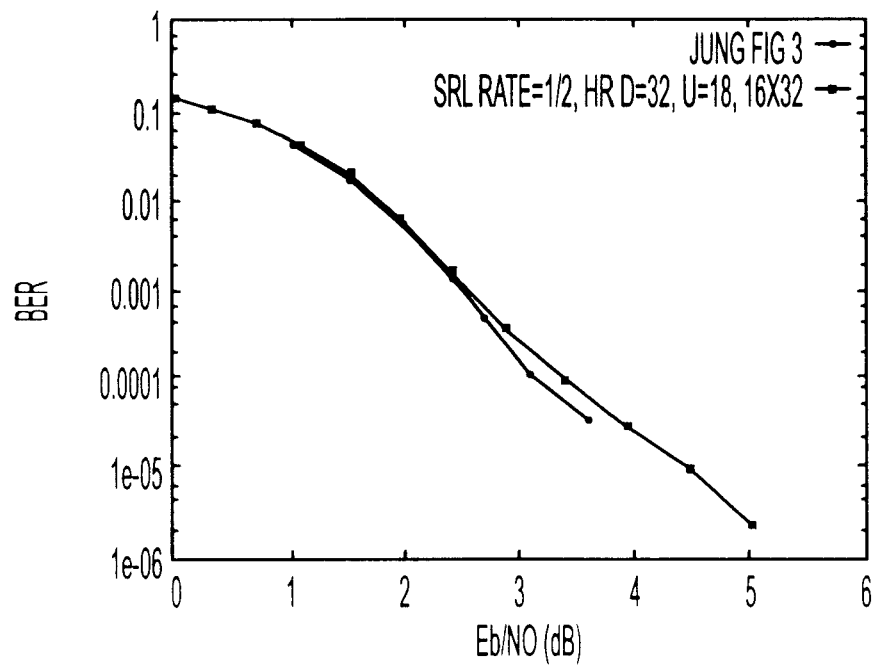
FIG. 8 graphically depicts BER performance with large saturation values for path reliability and extrinsic symbol reliability values according to the present invention.

FIGS. 7 and 8 show the comparisons between fixed-saturated, bit-by-bit traceback techniques and full-length traceback techniques as described in Peter Jung "Comparison of Turbo-Code Decoders Applied to Short Frame Transmission Systems," *IEEE Journal on Selected Areas in Communications*, 14(3):530–537, 1996. What is apparent is that fixed-saturation techniques provide benefits either in the low noise region or the high noise region but not in both simultaneously. FIG. 8 shows the performance of the symbol-by-symbol traceback technique with variable saturation. We can continue to use the simpler HR-SOVA update rule and obtain performance similar to non-symbol-by-symbol traceback implementation for a negligible extra complexity of variable saturation.

Figure 9:
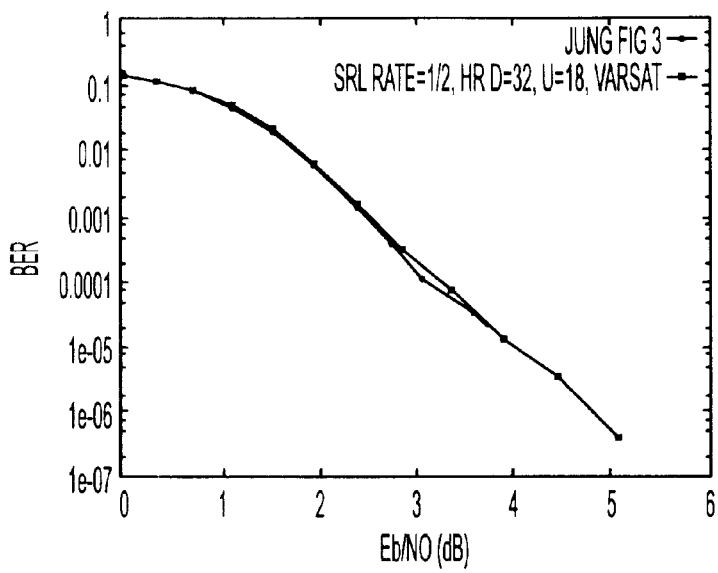
FIG. 9 graphically depicts BER performance with variable saturation values for path reliability and extrinsic symbol reliability values according to the present invention.
Figure 10:
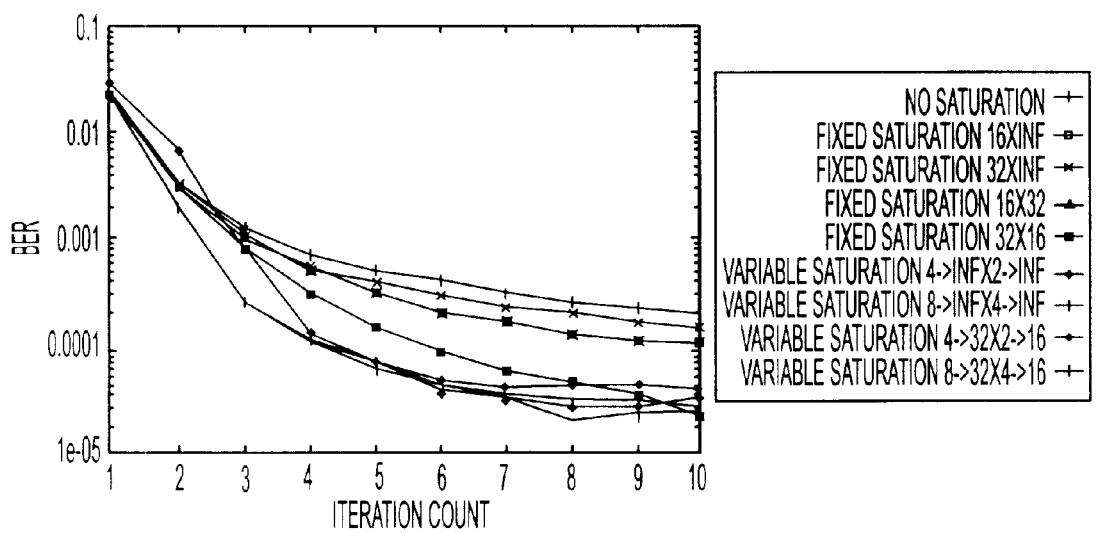
FIG. 10 graphically depicts BER convergence behavior of various saturation techniques, for a ½ rate CDMA2000 code according to the present invention.
Figure 11:
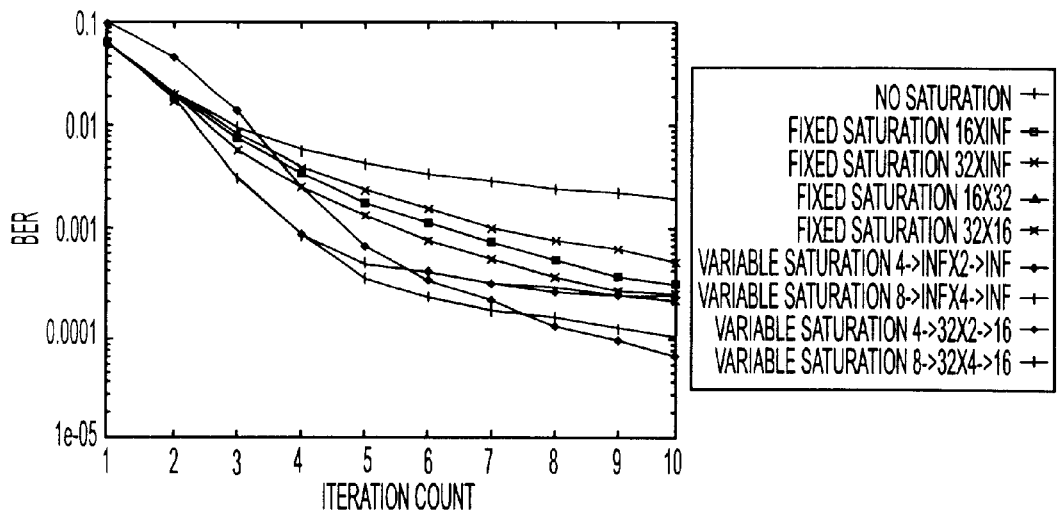
FIG. 11 graphically depicts BER convergence behavior of various saturation techniques, for a ⅓ rate CDMA2000 code according to the present invention.

FIGS. 9, 10 and 11 show the convergence behavior of the various saturation techniques. Careful review of the figures illustrates that variable saturation techniques take 5 to 6 iterations to reach the same BER performance which other saturation techniques require 8 to 10 iterations to achieve.

Figure 12:
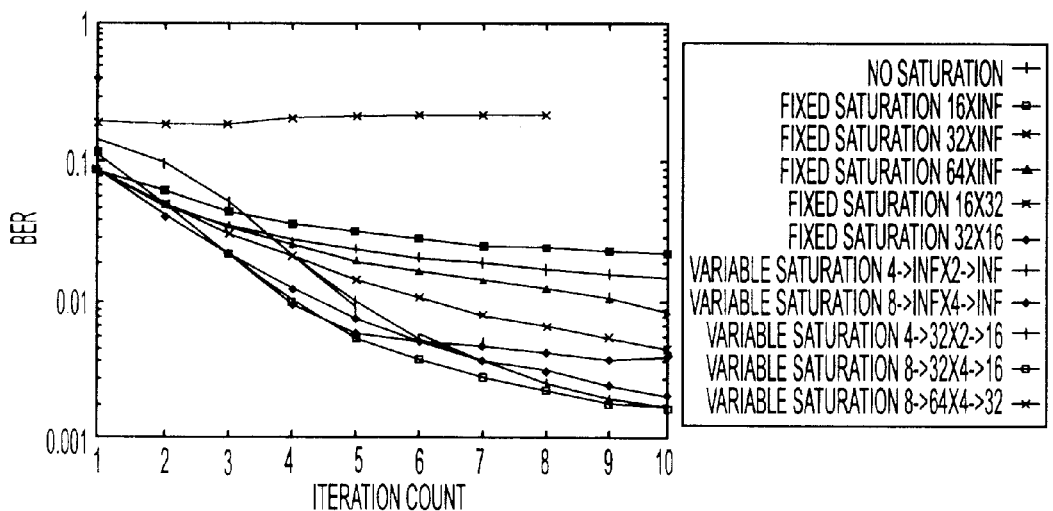
FIG. 12 graphically depicts BER convergence behavior of various saturation techniques, for a ¼ rate CDMA2000 code according to the present invention.

FIG. 12 depicts an additional modification to the design of the interleaver/deinterleaver memories as generally depicted in FIGS. 13, 14, 17, 18 and 19. The interleaver/de-interleaver memories are used to store the $L_E(u_k)$ values which, for example, need not be greater than ±16, thereby requiring 6-bits of storage per $L_E(u_k)$ value. By limiting $L_E(u_k)$ values to ±15, we reduce the storage to 5 bits per value. We can further reduce the values by dropping the least significant bit (LSB). To prevent any bias from being built in, the following operation is performed to create the $5^{th}$ bit at the output of the memories. Let $L_E(u_k)$ be represented by $x_4x_3x_2x_1x_0$. Then, only $x_4x_3x_2x_1$ is stored in memory. During reads, the sign bit, $x_4$, in this case, also serves as the least significant bit. This eliminates any bias by effectively rounding towards 0 by producing only even positive and negative values.

The path metric computation scales the contribution of $L_E(u_k)$ by a factor of ½ so the least significant bit LSB is effectively ignored. In the "de-correlation", the full precision value of $L_E(u_k)$ is subtracted. Hence a ½ unit in the least place (ulp) of error is introduced. It is expected that by eliminating bias in the rounding we eliminate this error and its impact on performance is negligible. The system architecture for implementing the TURBO decoding apparatus of the present invention is now described.

System Architecture

A first embodiment is described with reference to FIG. 13. A TURBO-code decoding apparatus 200, configured to decode a convolution encoded data frame using symbol-by-symbol traceback and APRI-SOVA decoders, is depicted. The apparatus 200 includes a first SOVA decoder 202 that generates a first path reliability value 204 from a channel value 206 and a parity symbol 208 of the encoded frame, and a first a priori likelihood value 210. A first decorrelation unit 212 then generates a first extrinsic symbol reliability value 214 by decorrelating the channel value 206 and the first a priori likelihood value 210 from the path reliability value 204. A first symbol reliability saturation unit 220 saturates the first extrinsic symbol reliability value 214 to generate a first saturated extrinsic symbol reliability value 240. A first interleaver 242 interleaves the first saturated extrinsic symbol reliability value 240 to generate a second a priori likelihood value 244. A second interleaver 246 interleaves the channel value 206 to generate an interleaved channel value 248 for a second stage of the decoder. The convolution encoded data frame is generated, for example, from a rate ⅓ 2-constituent-code, Turbo-code encoder utilizing two recursive systematic convolution codes. The codes are, for example, a 4-state code with generators (5, 7) and a 16-state with generators (23, 35). Details regarding convolution encoders are apparent to those skilled in the art of error control systems and are therefore set forth briefly for a proper understanding of the invention.

A second SOVA decoder 250 then generates a second path reliability value 252 from an interleaved parity symbol 254 of the encoded frame, the second a priori likelihood value 244, and the interleaved channel value 248. A second decorrelation unit 256 generates a second extrinsic symbol reliability value 258 by decorrelating the interleaved channel value 248 and the second a priori likelihood value 244 from the second path reliability value 252. A second symbol reliability saturation unit 260 saturates the second extrinsic symbol reliability value 258 to generate a second saturated extrinsic symbol reliability value 280. A first de-interleaver 282 de-interleaves the second saturated extrinsic symbol reliability value 280 to generate the first a priori likelihood value 210 as an input to the first SOVA decoder 202. The TURBO-code decoder 200 is completed by a second de-interleaver 290 that de-interleaves the second path reliability value to generate a decoded message of the convolution encoded data frame. Further details concerning the SOVA decoders 202 and 203 will be apparent to those skilled in the art of error control systems and are therefore not set forth herein except as needed for a proper understanding of the invention.

Figure 14:
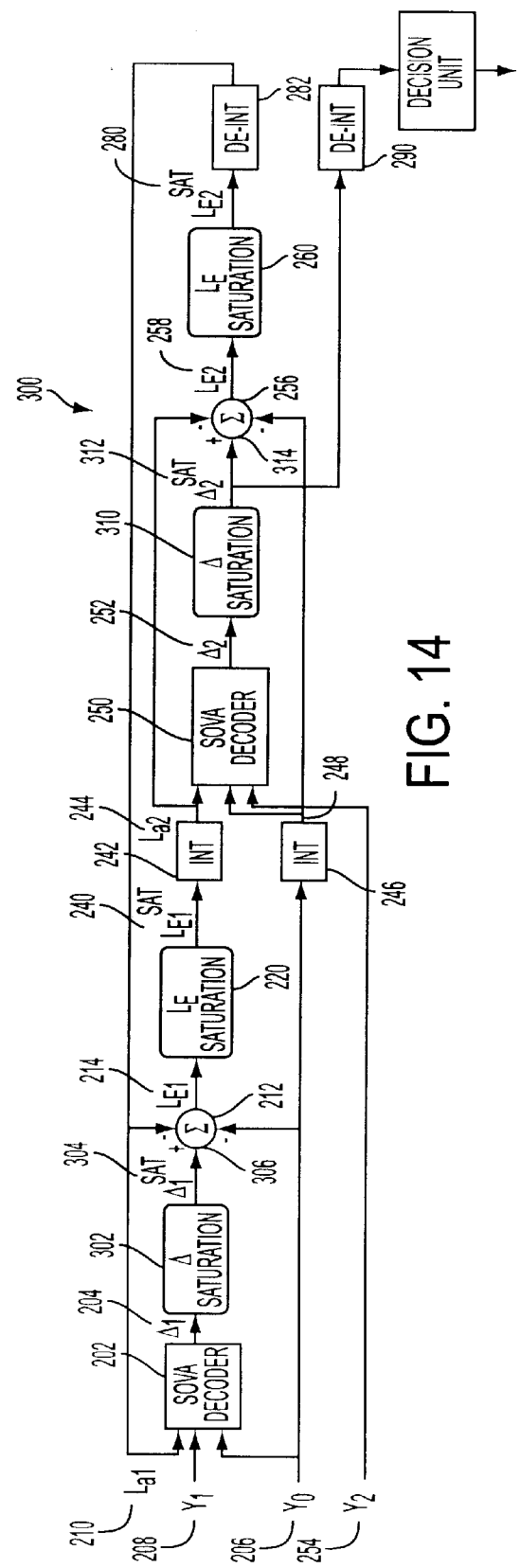
FIG. 14 depicts a TURBO-code decoding apparatus according to an exemplary embodiment of the invention.

FIG. 14 depicts the TURBO-code decoding apparatus 200 according to an exemplary embodiment of the invention 300 further including a first path reliability saturation unit 302 that saturates the first path reliability value 204 received from the first SOVA decoder 202 to generate a first saturated path reliability value 304 as an input 306 to the first decorrelation unit 212. A second path reliability saturation unit 310 is also included. The path reliability saturation unit 310 saturates the second path reliability value received 252 from the second SOVA decoder 250 to generate a second saturated path reliability value 312 as an input 314 to the second decorrelation unit 256 and the second de-interleaver 290.

In accordance with another embodiment of the invention depicted in FIG. 15, a first symbol reliability saturation unit 220 includes a saturation memory unit 222 that stores the first saturated extrinsic symbol reliability value ($L^{sat}_E$). A first adder gate 224 then generates $2*(L^{sat}_E)$ and a negative reliability value from the first saturated extrinsic symbol reliability value $-(L^{sat}_E)$. An input control gate 226 has a first state wherein $-(L^{sat}_E)$ is transferred as a saturation output 228 and a second state wherein $L^{sat}_E$ is transferred as the saturation output 228. The states of the input control gate 226 are determined based on a sign bit 230 of the first extrinsic symbol reliability value ($L^{in}_E$). The first extrinsic symbol reliability value ($L^{in}_E$) is stored in a symbol reliability memory unit 232. A second adder gate 234 then generates a control signal 236 from an addition operation of $L^{in}_E$ and the saturation output 228. The first symbol reliability saturation unit 220 is completed by an output control gate 238. The output control gate 238 has a first state wherein $L^{sat}_E$ is transferred to an output 239 of the output control gate 238 as an output saturated extrinsic symbol reliability value ($L^{out}_E$) 240. A second state transfers $-(L^{sat}_E)$ to the output 239 of the output control gate 238 as $L^{out}_E$. A third and final state transfers $L^{in}_E$ to the output of the output control gate 238 as $L^{out}_E$. The states of the output control gate 238 are determined based on the control signal 236.

In accordance with another embodiment of the invention also depicted as FIG. 15, the second path reliability saturation unit 260 includes the saturation memory unit 222 that stores the second saturated extrinsic symbol reliability value ($L^{sat}_E$). A first adder gate 224 then generates $2*(L^{sat}_E)$ and a negative reliability value from the second saturated extrinsic symbol reliability value $-(L^{sat}_E)$. An input control gate 226 has a first state wherein $-(L^{sat}_E)$ is transferred as a saturation output 228 and a second state wherein $L^{sat}_E$ is transferred as the saturation output 228. The states of the input control gate 226 are determined based on a sign bit 230 of the second extrinsic symbol reliability value. The second extrinsic symbol reliability value ($L^{in}_E$) is then stored in a symbol reliability memory unit 232. A second adder gate 234 generates a control signal 236 from an addition operation of $L^{in}_E$ and the saturation output 228. An output control gate 238 has a first state wherein $L^{sat}_E$ is transferred to an output 239 of the output control gate 238 as an output saturated extrinsic symbol reliability value ($L^{out}_E$) 280. In a second state, $-(L^{sat}_E)$ is transferred to the output of the output control gate as $L^{out}_E$. In a third and final state, $L^{in}_E$ is transferred to the output 239 of the output control gate 238 as $L^{out}_E$ 280. The states of the output control gate 238 are determined based on the control signal 236.

In accordance with another embodiment of the invention depicted in FIG. 16, the first path reliability saturation unit 302 includes a saturation memory unit 320 that stores the first saturated path reliability value $\Delta_{sat}$. A first adder gate 322 then generates $2*(\Delta_{sat})$. An input control gate 324 has a first state wherein $\Delta_{sat}$ is transferred as a saturation output 326 and a second state wherein $2*(\Delta_{sat})$ is transferred as the saturation output 326. The states of the input control gate 324 are determined based on a sign bit 328 of the first path reliability value ($\Delta_{in}$), such that $\Delta_{in}$ is stored in a path reliability memory unit. A second adder gate 332 generates a control signal 334 from an addition operation of $\Delta_{in}$ and the saturation output 326. A third adder gate 336 generates a negative reliability value from the first path reliability value $-(\Delta_{in})$ An output control gate 338 has a first state wherein $\Delta_{sat}$ is transferred to an output 340 of the output control gate 338 as an output saturated path reliability value ($\Delta_{out}$) 304. A second state transfers $-(\Delta_{in})$ to the output 340 of the output control gate 338 as $\Delta_{out}$. In a third and final state $\Delta_{in}$ is transferred to the output 340 of the output control gate 338 as $\Delta_{out}$ 304. The states of the output control gate 338 are determined based on the control signal 334.

In accordance with another embodiment of the invention also depicted as FIG. 16, the second path reliability saturation unit 310 includes the saturation memory unit 320 that stores the second saturated path reliability value $\Delta_{sat}$. A first adder gate 322 then generates $2^*(\Delta_{sat})$. An input control gate 324 has a first state wherein $\Delta_{sat}$ is transferred as a saturation output 326 and a second state wherein $2^*(\Delta_{sat})$ is transferred as the saturation output 326. The states of the input control gate 324 are determined based on a sign bit 328 of the first path reliability value ($\Delta_{in}$), such that $\Delta_{in}$ is stored in the path reliability memory unit 330. A second adder gate 332 generates a control signal 334 from an addition operation of $\Delta_{in}$ and the saturation output 326. A third adder gate 336 generates a negative reliability value from the second path reliability value $-(\Delta_{in})$. An output control gate 338 has a first state wherein $\Delta_{sat}$ is transferred to the output 340 of the output control gate 338 as an output saturated path reliability value ($\Delta_{out}$) 312. In a second state $-(\Delta_{in})$ is transferred to the output 340 of the output control 338 gate as $\Delta_{out}$ 312. In a third and final state $\Delta_{in}$ is transferred to the output 340 of the output control gate 338 as $\Delta_{out}$ 312. The states of the output control gate 338 are determined based on the control signal 334.

Figure 17:
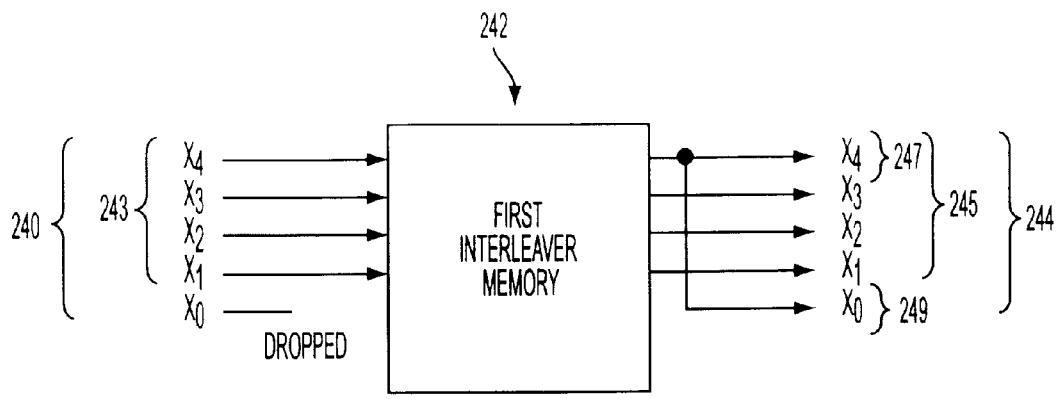
FIG. 17 depicts a first interleaver memory according to an exemplary embodiment of the invention.
Figure 18:
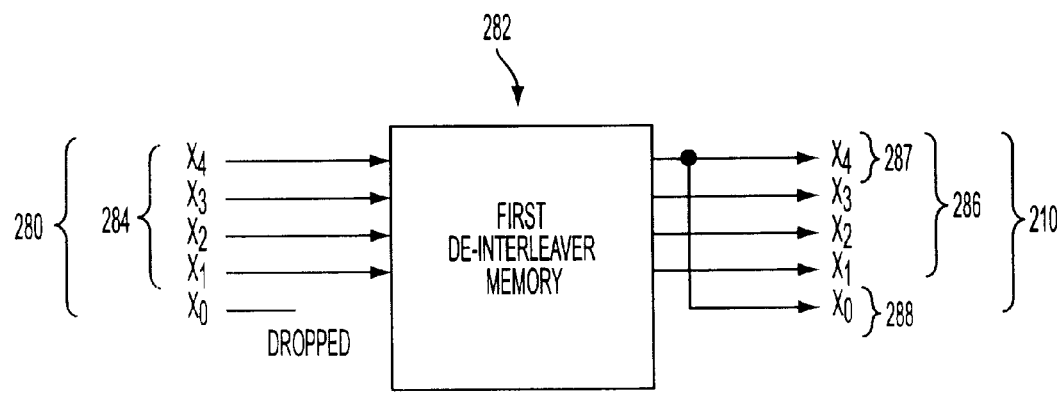
FIG. 18 depicts a first de-interleaver memory according to an exemplary embodiment of the invention.
Figure 19:
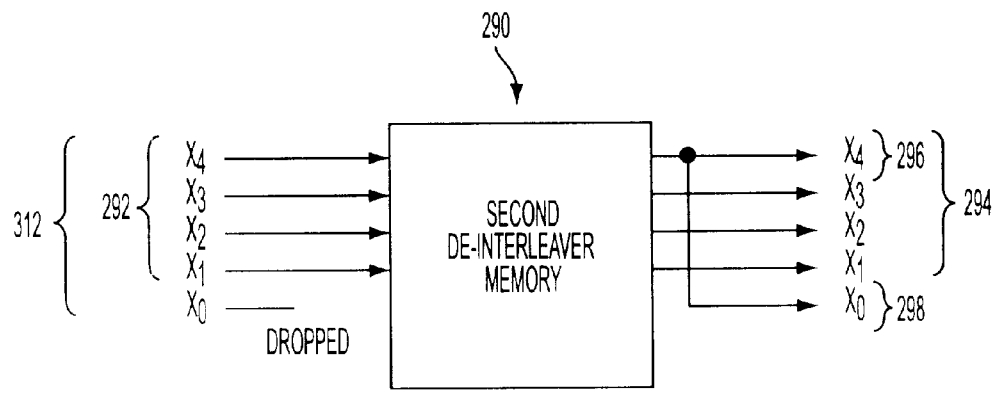
FIG. 19 depicts a second de-interleaver memory according to an exemplary embodiment of the invention.

In accordance with another embodiment of the invention depicted in FIGS. 17, 18 and 19, the first interleaver 242 stores a four most significant bits (MSB) 243 of the first saturated extrinsic symbol reliability value 240 which is comprised of five bits. The four bit first extrinsic symbol reliability 243 is then interleaved to generate a four bit second a priori value 245. The MSB of the four bit a priori value 247 is used as a fifth least significant bit (LSB) 249 to generate the second a priori value as a five bit symbol 244. The first de-interleaver 282, depicted in FIG. 18, also stores a four MSB 284 of the second extrinsic symbol reliability value 280 which is comprised of five bits. The four bit second saturated extrinsic symbol reliability value 284 is then de-interleaved to generate a four bit first a priori value 286. The MSB 287 of the four bit first a priori value 286 is used as a fifth LSB 288 to generate the second a priori value 244. The second de-interleaver 290, depicted in FIG. 19, also stores a four MSB 292 of the second saturated path symbol reliability value 312 which is comprised of five bits. The four bit second saturated path symbol reliability value 292 is then de-interleaved to generate a four bit soft output 294. MSB 296 of the four bit soft output 294 is used as a fifth LSB 296 to generate the decoded message.

OPERATION

Figure 13:
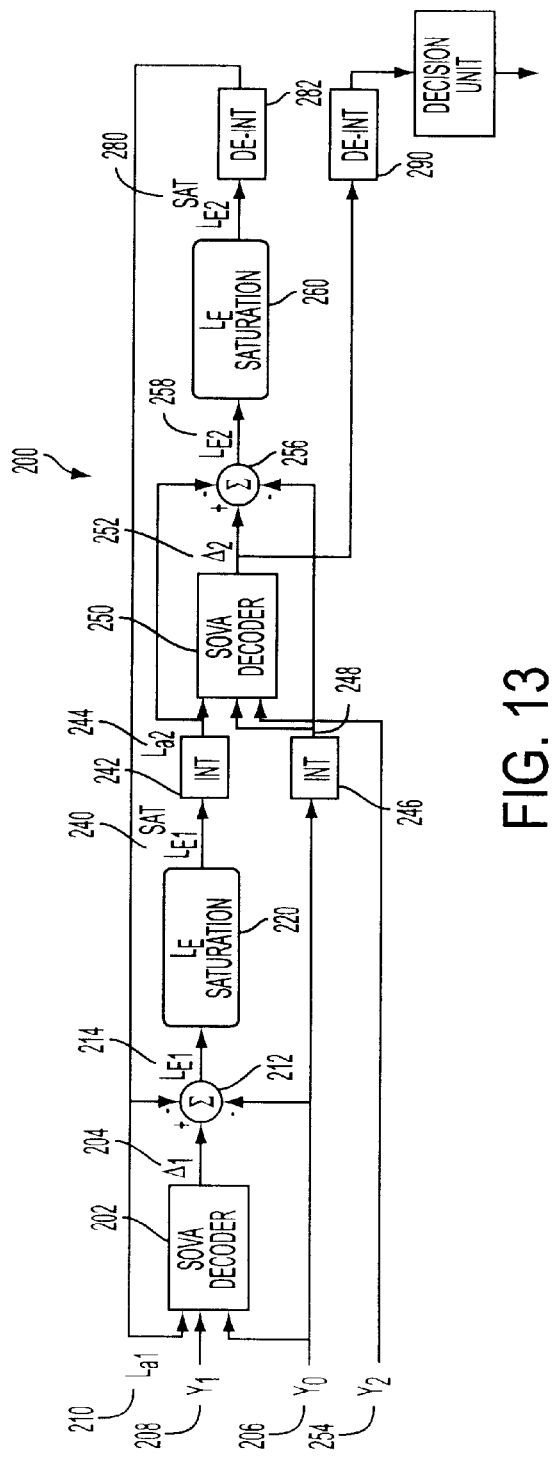
FIG. 13 depicts a TURBO-code decoding apparatus according to a first embodiment of the invention.
Figure 20:
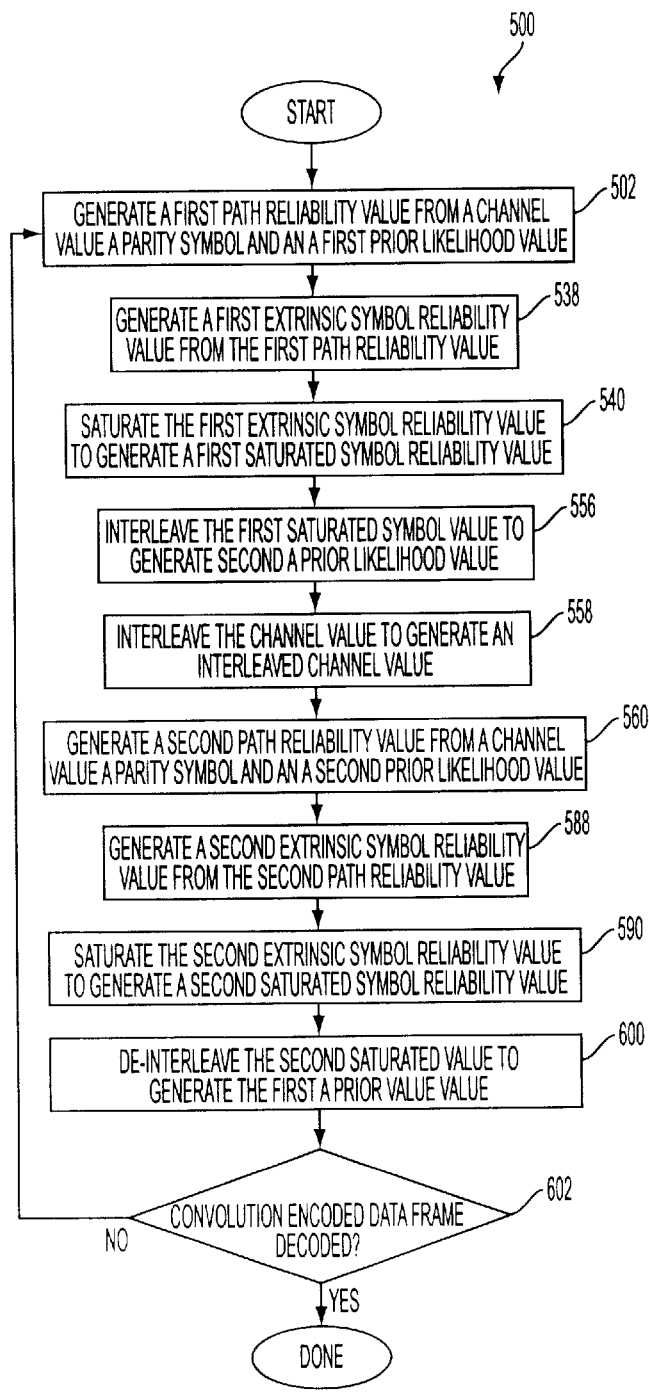
FIG. 20 depicts method steps for TURBO-code decoding a convolution encoded data frame according to an embodiment of the invention.

FIG. 20 depicts a procedure 500 for TURBO-code decoding a convolution encoded data frame using symbol-by-symbol traceback and APRI-SOVA, for example, as depicted in FIG. 13. At step 502, a first path reliability value 204 is generated from a channel value 206 and a parity symbol 208 of the encoded frame, and a first a priori likelihood value 210 using a first SOVA decoder 202. At step 538, a first extrinsic symbol reliability value 214 is generated by decorrelating the channel value 206 and the first a priori likelihood value 210 from the first path reliability value 204. At step 540, the first extrinsic symbol reliability value 214 is saturated to generate a first saturated symbol reliability value 240. At step 556, the saturated symbol reliability value 240 is interleaved to generate a second a priori likelihood value 244. At step 558, the channel value 206 is interleaved to generate an interleaved channel value 248. At step 560, a second path reliability value 252 is generated from an interleaved parity symbol 254 of the encoded frame, the second a priori likelihood value 244, and the interleaved channel value 248 using a second SOVA decoder 250. At step 588, a second extrinsic symbol reliability value 258 is generated by decorrelating the interleaved channel value 248 and the second a priori likelihood value 244 from the second path reliability value 252. At step 590, the second extrinsic symbol reliability value 258 is saturated to generate a second saturated symbol reliability value 280. At step 600, the second saturated symbol reliability value 280 is de-interleaved to generate the first a priori value 210 as an input for the first SOVA decoder 202. Finally at step 602, steps 502 through 600 are repeated until each symbol of the convolution encoded data frame is processed and the convolution encoded data frame is decoded.

Figure 21:
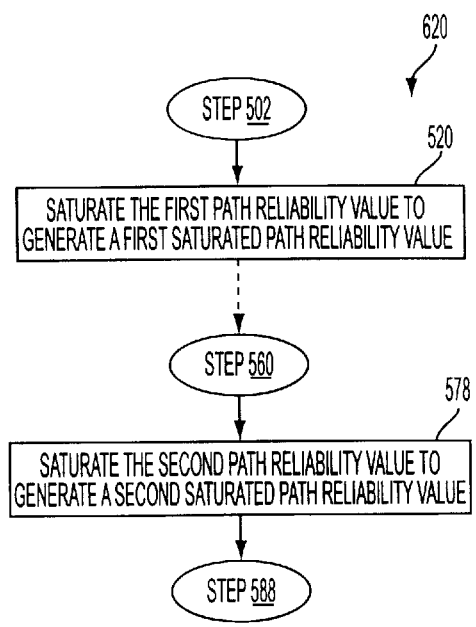
FIG. 21 depicts method steps for saturating the first and second path reliability values according to an exemplary embodiment of the invention.

FIG. 21 depicts additional procedural method steps 620 for the TURBO-code decoding of the convolution encoded data frame procedure 500, for example, as depicted in FIG. 14. At step 520, the first path reliability value 304 is saturated prior to the step 560 of generating the extrinsic symbol reliability value to generate a first saturated path reliability value 204. Finally at step 578, the second path reliability value is saturated prior to the step 588 of generating the second extrinsic symbol reliability value 258 to generate a second saturated path reliability value 312.

Figure 22:
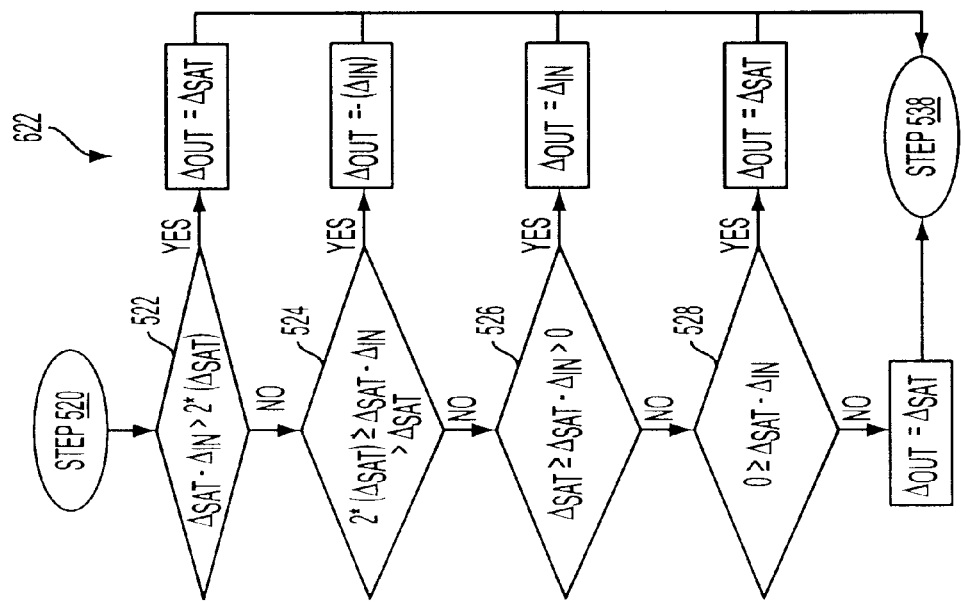
FIG. 22 depicts additional method steps for saturating the first path reliability values according to an exemplary embodiment of the invention.

FIG. 22 depicts additional method steps 622 for saturating the first path reliability value 204 in step 520 of the TURBO-code decoding of the convolution encoded data frame procedure 500, for example, in the first path reliability saturation unit 302, as depicted in FIG. 16. At step 522, when the first saturated path reliability value ($\Delta_{sat}$) minus (−) the first path reliability value ($\Delta_{in}$) ($\Delta_{sat}-\Delta_{in}$) is greater than (>) twice the first saturated path reliability value ($\Delta_{sat}-\Delta_{in}>2^*(\Delta_{sat})$), an output saturated symbol reliability value ($\Delta_{out}$) is set equal to the second saturated path reliability value $\Delta_{out}=\Delta_{sat}$. At step 524, when $2^*(\Delta_{sat}) \geq \Delta_{sat}-\Delta_{in}>\Delta^{sat}_E$, setting $\Delta_{out}=-(\Delta_{in})$. At step 526, when $\Delta_{sat} \geq \Delta_{sat}-\Delta_{in}>0$, setting $\Delta_{out}=\Delta_{in}$. Finally at step 528, when $0 \geq \Delta_{sat}-\Delta_{in}$, setting $\Delta_{out}=\Delta_{sat}$.

Figure 23:
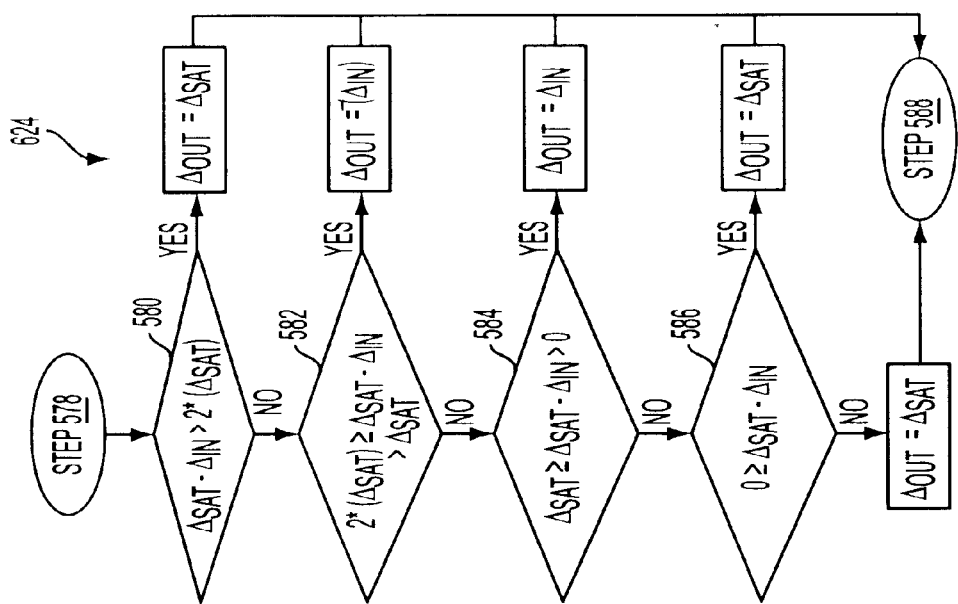
FIG. 23 depicts additional method steps for saturating the second path reliability values according to an exemplary embodiment of the invention.

FIG. 23 depicts additional method steps 624 for saturating the second path reliability value 252 in step 578 of the TURBO-code decoding of the convolution encoded data frame procedure 500, for example, in the second path reliability saturation unit 310, as depicted in FIG. 16. At step 580, when the second saturated path reliability value ($\Delta_{sat}$) minus (−) the second path reliability value ($\Delta_{in}$) ($\Delta_{sat}-\Delta_{in}$) is greater than (>) twice the second saturated path reliability value ($\Delta_{sat}-\Delta_{in}>2^*(\Delta_{sat})$), setting an output saturated path reliability value ($\Delta_{out}$) equal to the second saturated path reliability value ($\Delta_{out}=\Delta_{sat}$). At step 582, when $2^*(\Delta_{sat}) \geq \Delta_{sat}-\Delta_{in}>\Delta^{sat}_E$, setting $\Delta_{out}=-(\Delta_{in})$. At step 584, when $\Delta_{sat} \geq \Delta_{sat}-\Delta_{in}>0$, setting $\Delta_{out}=\Delta_{in}$. Finally at step 586, when $0 \geq \Delta_{sat}-\Delta_{in}$, setting $\Delta_{out}=\Delta_{sat}$.

Figure 24:
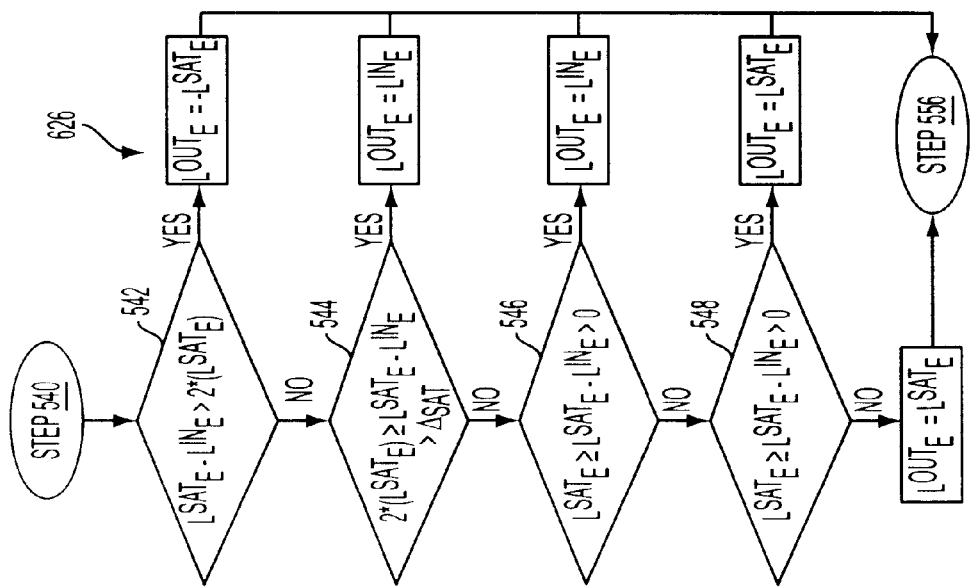
FIG. 24 depicts additional method steps for saturating the first extrinsic symbol reliability values according to an embodiment of the invention.

FIG. 24 depicts additional method steps 626 for saturating the first extrinsic symbol reliability value 214 in step 540 of the TURBO-code decoding of the convolution encoded data frame procedure 500, for example, in the first symbol reliability saturation unit 220, as depicted in FIG. 15. At step 542, when the first saturated extrinsic symbol reliability value ($L^{sat}_E$) minus (−) the first extrinsic symbol reliability value ($L^{in}_E$)($L^{sat}_E - L^{in}_E$) is greater than (>) twice the first saturated extrinsic symbol reliability value ($L^{sat}_E - L^{in}_E > 2*(L^{sat}_E)$), setting an output saturated extrinsic symbol reliability value ($L^{out}_E$) equal to a negative saturated value of the first saturated extrinsic symbol reliability value ($-(L^{sat}_E))(L^{out}_E = -(L^{sat}_E))$. At step 544, when $2*(L^{sat}_E) \geq L^{sat}_E - L^{in}_E > L^{sat}_E$, setting $L^{out}_E = L^{in}_E$. At step 546, when $LL^{sat}_E \geq L^{sat}_E - L^{in}_E > 0$, setting $L^{out}_E = L^{in}_E$. Finally at step 548, when $0 \geq L^{sat}_E - L^{in}_E$, setting $L^{out}_E = L^{sat}_E$.

Figure 25:
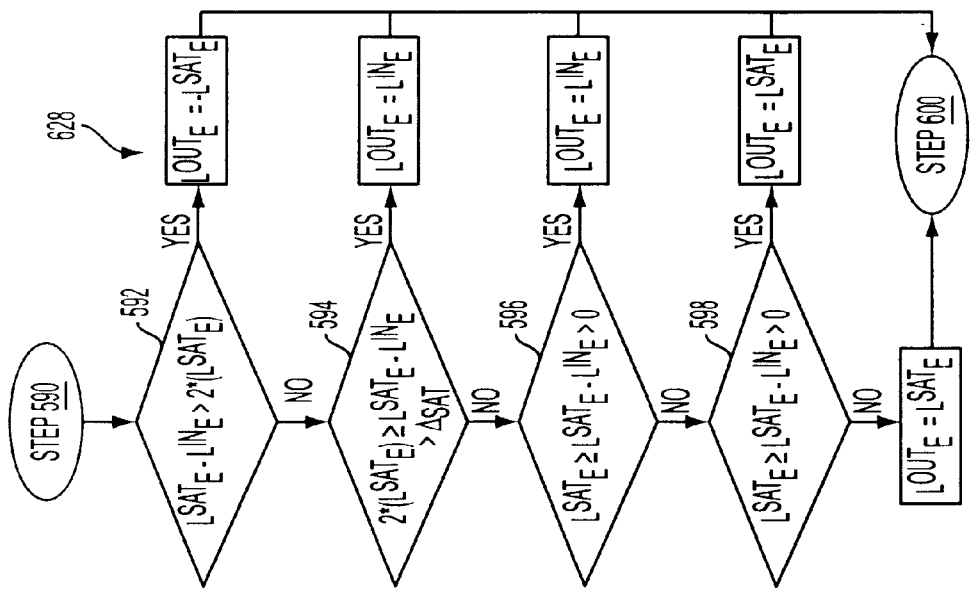
FIG. 25 depicts additional method steps for saturating the second extrinsic symbol reliability values according to an embodiment of the invention.

FIG. 25 depicts additional method steps 628 for saturating the second extrinsic symbol reliability value 258 in step 590 of the TURBO-code decoding of the convolution encoded data frame procedure 500, for example, in the second symbol reliability saturation unit 260, as depicted in FIG. 15. At step 592, when the second saturated extrinsic symbol reliability value ($L^{sat}_E$) minus (−) the second extrinsic symbol reliability value ($L^{in}_E$)($L^{sat}_E - L^{in}_E$) is greater than (>) twice the second saturated extrinsic symbol reliability value ($L^{sat}_E > L^{in}_E - 2*(L^{sat}_E)$), setting an output saturated extrinsic symbol reliability value ($L^{out}_E$) equal to a negative saturated value of the second saturated extrinsic symbol reliability value ($-(L^{sat}_E))(L^{out}_E = -(L^{sat}_E))$. At step 594, when $2*(L^{sat}_E) \geq L^{sat}_E - L^{in}_E > L^{sat}_E$, setting $L^{out}_E = L^{in}_E$. At step 596, when $L^{sat}_E \geq L^{sat}_E - L^{in}_E > 0$, setting $L^{out}_E = L^{in}_E$. Finally at step 598, when $0 \geq L^{sat}_E - L^{in}_E$, setting $L^{out}_E = L^{sat}_E$.

Figures 26, 27:
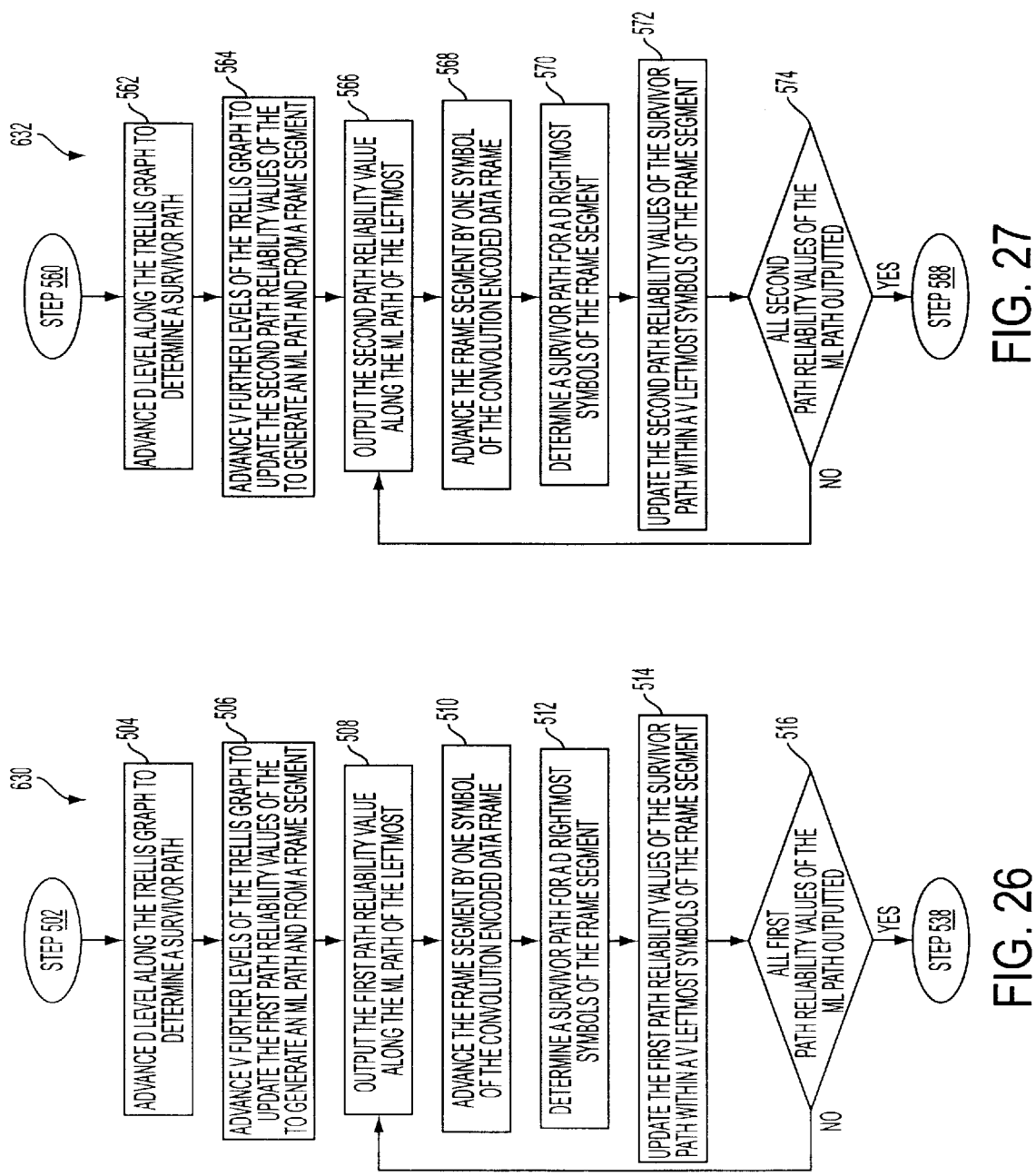
FIG. 26 depicts method steps for generating the first path reliability value according to an exemplary embodiment of the invention.
FIG. 27 depicts method steps for generating the second path reliability value according to an exemplary embodiment of the invention.

FIG. 26 depicts additional method steps 630 for generating the first path reliability value 204 in step 502 of the TURBO-code decoding procedure 500, for example, in the first SOVA decoder 202, as depicted in FIG. 13. At step 504, a minimum number of levels D are advanced along a trellis graph to determine a survivor path after receiving D symbols of the convolution encoded data frame. At step 506, V further levels of the trellis graph are advanced to update the first path reliability value 204 of the survivor path to generate a maximum likelihood (ML) path after receiving V further symbols of the convolution encoded data frame to form a frame segment. At step 508, the first path reliability value 204 is outputted along the ML path of the leftmost symbol of the frame segment. At step 510, the frame segment is advanced by one symbol of the convolution encoded data frame. At step 512, a survivor path is determined for a D rightmost symbols of the frame segment. At step 514, the first path reliability value 204 of the survivor path is updated within a V leftmost symbols of the frame segment. Finally at step 516, steps 508 through 514 are repeated until each first path reliability value 204 of the ML path of the convolution encoded data frame is outputted.

Although not depicted, an additional method step for updating the first path reliability first SOVA decoder 202, as depicted in FIGS. 13 and 14 includes when the competitor path differs from the ML path, setting the first path reliability value 204 of each ML path symbol that differs from a symbol of the competitor path to the minimum of the first path reliability value 204 and the first a priori likelihood value 210 of the ML path symbol.

FIG. 27 depicts additional method steps 632 for generating the second path reliability value 252 in step 560 of the TURBO-code decoding procedure 500, for example, in the second SOVA decoder 250, as depicted in FIG. 13. At step 562, a minimum number of levels D are advanced along a trellis graph to determine a survivor path after receiving D symbols of the convolution encoded data frame. At step 564, V further levels of the trellis graph are advanced to update the second path reliability value 252 of the survivor path to generate a maximum likelihood (ML) path after receiving V further symbols of the convolution encoded data frame to form a frame segment. At step 566, the second path reliability value 252 is outputted along the ML path of the leftmost symbol of the frame segment. At step 568, the frame segment is advanced by one symbol of the convolution encoded data frame. At step 570, a survivor path is determined for a D rightmost symbols of the frame segment. At step 572, the second path reliability value 252 of the survivor path is updated within a V leftmost symbols of the frame segment. Finally at step 574, steps 566 through 572 are repeated until each second path reliability value 252 of the ML path of the convolution encoded data frame is outputted.

Although not depicted, an additional method step for updating the second path reliability value in step 252 of the TURBO-code decoding procedure 500, for example, in the second SOVA decoder 250, as depicted in FIGS. 13 and 14, includes when the competitor path differs from the ML path, setting the second path reliability value 252 of each ML path symbol that differs from a symbol of the competitor path to the minimum of the second path reliability value 252 and the second a priori likelihood value 244 of the ML path symbol.

Exemplary embodiments have been described with reference to specific configurations. Those skilled in the art will appreciate that various changes and modifications can be made while remaining within the scope of the claims. It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the saturation techniques of the present invention can be applied to most soft-output decoding techniques. In addition, although the preferred embodiment described herein is directed to Turbo-code decoding apparatus, it will be appreciated by those skilled in the art that the teachings of the present invention can be applied to other systems for error correction and detection utilizing soft-input/soft-output decoding.

The invention provides many advantages over known techniques. The present invention can be applied to both software and hardware implementations of channel codes employing turbo-codes that use the SOVA algorithm. Suitable candidates are the $3^{rd}$ generation cellular telephony standards (Wireband CDMA (WCDMA) and code division multiple access 2000 (CDMA2000) a CDMA standard proposed by Qualcomm, Inc.) which employ turbo-codes in their channel codes. In addition to providing a simplified implementation, hardware employing the saturation technique of the present invention benefits by having improved BER characteristics. Furthermore this saturation technique results in faster convergence, thereby requiring fewer decoding iterations to generate a result as compared to fixed-saturation techniques and non-saturating techniques. This can help reduce the power consumption or handle higher data rates as necessary. Compared to non-saturating techniques, the saturation technique of the present invention requires a smaller word size for the first and second extrinsic symbol values, resulting in reliability reduced sizes for the interleaver memories.

All publications and patent applications mentioned in this specification are herein incorporated by reference to the same extent as if each individual publication or patent application was specifically and individually indicated to be incorporated by reference.

Having disclosed exemplary embodiments and the best mode, modifications and variations may be made to the disclosed embodiments while remaining within the scope of the invention as defined by the following claims.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for TURBO-code decoding a convolution encoded data frame using symbol-by-symbol traceback and APRI-SOVA, the method comprising steps of:
   generating a first path reliability value from a channel value and a parity symbol of the encoded frame, and a first a priori likelihood value using a first SOVA decoder;
   generating a first extrinsic symbol reliability value by decorrelating the channel value and the first a priori likelihood value from the first path reliability value;
   saturating the first extrinsic symbol reliability value to generate a first saturated symbol reliability value;
   interleaving the first saturated reliability value to generate a second a priori likelihood value;
   interleaving the channel value to generate an interleaved channel value;
   generating a second path reliability value from an interleaved parity symbol of the encoded frame, the second a priori likelihood value, and the interleaved channel value using a second SOVA decoder;
   generating a second extrinsic symbol reliability value by decorrelating the interleaved channel value and the second a priori likelihood value from the second path reliability value;
   saturating the second extrinsic symbol reliability value to generate a second saturated symbol reliability value;
   de-interleaving the second saturated symbol reliability value to generate the first a prior value as an input for the first SOVA decoder; and
   repeating the aforementioned steps until each symbol of the convolution encoded data frame is processed and the convolution encoded data frame is decoded.

2. The method of claim 1, further including steps of:
   saturating the first path reliability value prior to the step of generating the extrinsic symbol reliability value to generate a first saturated path reliability value; and
   saturating the second path reliability value prior to the step of generating the second extrinsic symbol reliability value to generate a second saturated path reliability value.

3. The method of claim 2, wherein the saturating the first path reliability value step further includes steps of:
   when the first saturated path reliability value ($\Delta_{sat}$) minus (−) the first path reliability value ($\Delta_{in}$)($\Delta_{sat}-\Delta_{in}$) is greater than (>) twice the first saturated path reliability value ($\Delta_{sat}-\Delta_{in}>2*(\Delta_{sat})$), setting an output saturated symbol reliability value ($\Delta_{out}$) equal to the second saturated path reliability value $\Delta_{out}=\Delta_{sat}$;

when $2*(\Delta_{sat}) \geq \Delta_{sat}-\Delta_{in} > \Delta^{sat}_E$, setting $\Delta_{out}=-(\Delta_{in})$
   when $\Delta_{sat} \geq \Delta_{sat}-\Delta_{in} > 0$, setting $\Delta_{out}=\Delta_{in}$; and
   when $0 \geq \Delta_{sat}-\Delta_{in}$, setting $\Delta_{out}=\Delta_{sat}$.

4. The method of claim 2, wherein the saturating the second path reliability value step further includes steps of:
   when the second saturated path reliability value ($\Delta_{sat}$) minus (−) the second path reliability value ($\Delta_{in}$)($\Delta_{sat}-\Delta_{in}$) is greater than (>) twice the second saturated path reliability value ($\Delta_{sat}-\Delta_{in}>2*(\Delta_{sat})$), setting an output saturated path reliability value ($\Delta_{out}$) equal to the second saturated path reliability value ($\Delta_{out}=\Delta_{sat}$);
   when $2*(\Delta_{sat}) \geq \Delta_{sat}-\Delta_{in} > \Delta^{sat}_E$, setting $\Delta_{out}=-(\Delta_{in})$
   when $\Delta_{sat} \geq \Delta_{sat}-\Delta_{in} > 0$, setting $\Delta_{out}=\Delta_{in}$; and
   when $0 \geq \Delta_{sat}-\Delta_{in}$, setting $\Delta_{out}=\Delta_{sat}$.

5. The method of claim 1, wherein the saturating the first extrinsic symbol reliability value step further includes steps of:
   when the first saturated extrinsic symbol reliability value ($L^{sat}_E$) minus (−) the first extrinsic symbol reliability value ($L^{in}_E$)($L^{sat}_E-L^{in}_E$) is greater than (>) twice the first saturated extrinsic symbol reliability value ($L^{sat}_E-L^{in}_E>2*(L_{satE})$), setting an output saturated extrinsic symbol reliability value ($L^{out}_E$) equal to a negative saturated value of the saturated extrinsic symbol reliability value ($-(L^{sat}_E))(L^{out}_E=-(L^{sat}_E))$;
   when $2*(L^{sat}_E) \geq L^{sat}_E-L^{in}_E > L^{sat}_E$, setting $L^{out}_E=L^{in}_E$;
   when $L^{sat}_E \geq L^{sat}_E-L^{in}_E > 0$, setting $L^{out}_E=L^{in}_E$; and
   when $0 \geq L^{sat}_E-L^{in}_E$, setting $L^{out}_E=L^{sat}_E$.

6. The method of claim 1, wherein the saturating the second extrinsic symbol reliability value step further includes steps of:
   when the second saturated extrinsic symbol reliability value ($L^{sat}_E$) minus (−) the second extrinsic symbol reliability value ($L^{in}_E$)($L^{sat}_E-L^{in}_E$) is greater than (>) twice the second saturated extrinsic symbol reliability value ($L^{sat}_E-L^{in}_E>2*(L^{sat}_E)$), setting an output saturated extrinsic symbol reliability value ($L^{out}_E$) equal to a negative saturated value of the second saturated extrinsic symbol reliability value $(-(L^{sat}_E))(L^{out}_E=-(L^{sat}_E))$;
   when $2*(L^{sat}_E) \geq L^{sat}_E-L^{in}_E > L^{sat}_E$, setting $L^{out}_E=L^{in}_E$;
   when $L^{sat}_E \geq L^{sat}_E-L^{in}_E > 0$, setting $L^{out}_E=L^{in}_E$; and
   when $0 \geq L^{sat}_E-L^{in}_E$, setting $L^{out}_E=L^{sat}_E$.

7. The method of claim 1, wherein the step of generating the first path reliability value further comprises steps of:
   advancing a minimum number of levels D along a trellis graph to determine a survivor path after receiving D symbols of the convolution encoded data frame;
   advancing V further levels of the trellis graph to update the first path reliability value of the survivor path to generate a maximum likelihood (ML) path after receiving V further symbols of the convolution encoded data frame to form a frame segment;
   outputting the first path reliability value along the ML path of a leftmost symbol of the frame segment;
   advancing the frame segment by one symbol of the convolution encoded data frame;
   determining a survivor path for a D rightmost symbols of the frame segment;
   updating the first path reliability value of the survivor path within a V leftmost symbols of the frame segment; and
   repeating the outputting, advancing, determining and updating steps until each first path reliability value of the ML path of the convolution encoded data frame is outputted.

8. The method of claim 7, wherein the first path reliability value updating step further comprises steps of:

when the competitor path differs from the ML path setting the first path reliability value of each ML path symbol that differs from a symbol of the competitor path to the minimum of the first path reliability value and the first a priori likelihood value of the ML path symbol.

9. The method of claim 1, wherein the step of generating a second path reliability value further comprises steps of:

advancing a minimum number of levels D along a trellis graph to determine a survivor path after receiving D symbols of the convolution encoded data frame;

advancing V further levels of the trellis graph to update the second path reliability value of the survivor path to generate a maximum likelihood (ML) path after receiving V further symbols of the convolution encoded data frame to form a frame segment;

outputting the second path reliability value along the ML path of a leftmost symbol of the frame segment;

advancing the frame segment by one symbol of the convolution encoded data frame;

determining a survivor path for a D rightmost symbols of the frame segment;

updating the second path reliability value of the survivor path within a V leftmost symbols of the frame segment; and repeating the outputting, advancing, determining and updating steps until each second path reliability value of the ML path of the convolution encoded data frame is outputted.

10. The method of claim 9, wherein the second path reliability value updating step further comprises steps of:

when the competitor path differs from the ML path setting the second path reliability value of each ML path symbol that differs from a symbol of the competitor path to the minimum of the second path reliability value and the second a priori likelihood value of the ML path symbol.

11. A TURBO-code decoding apparatus configured to decode a convolution encoded data frame using symbol-by-symbol traceback and APRI-SOVA, the apparatus comprised of:

a first SOVA decoder configured to generate a first path reliability value from a channel value and a parity symbol of the encoded frame, and a first a priori likelihood value;

a first decorrelation unit configured to generate a first extrinsic symbol reliability value by decorrelating the channel value and the first a priori likelihood value from the path reliability value;

a first symbol reliability saturation unit configured to saturate the first extrinsic symbol reliability value to generate a first saturated extrinsic symbol reliability value;

a first interleaver configured to interleave the first saturated extrinsic symbol reliability value to generate a second a priori likelihood value;

a second interleaver configured to interleave the channel value to generate an interleaved channel value;

a second SOVA decoder configured to generate a second path reliability value from an interleaved parity symbol of the encoded frame, the second a priori likelihood value, and the interleaved channel value;

a second decorrelation unit configured to generate a second extrinsic symbol reliability value by decorrelating the interleaved channel value and the second a priori likelihood value from the second path reliability value;

a second symbol reliability saturation unit configured to saturate the second extrinsic symbol reliability value to generate a second saturated extrinsic symbol reliability value;

a first de-interleaver configured to de-interleave the second saturated extrinsic symbol reliability value to generate the first a priori likelihood value as an input to the first SOVA decoder; and a second de-interleaver configured to de-interleave the second path reliability value to generate a decoded message of the convolution encoded data frame.

12. The TURBO-code decoding apparatus of claim 11, wherein the first symbol reliability saturation unit is comprised of:

a saturation memory unit configured to store the first saturated extrinsic symbol reliability value ($L^{sat}_E$);

a first adder gate configured to generate $2*(L^{sat}_E)$ and a negative reliability value from the first saturated extrinsic symbol reliability value $-(L^{sat}_E)$;

an input control gate having a first state wherein $-(L^{sat}_E)$ is transferred as a saturation output and a second state wherein $L^{sat}_E$ is transferred as the saturation output, such that the states of the input control gate are determined based on a sign bit of the first extrinsic symbol reliability value ($L^{in}_E$);

a symbol reliability memory unit configured to store $L^{in}_E$;

a second adder gate configured to generate a control signal from an addition operation of $L^{in}_E$ and the saturation output; and an output control gate having a first state wherein $L^{sat}_E$ is transferred to an output of the output control gate as an output saturated extrinsic symbol reliability value ($L^{out}_E$), a second state wherein $-(L^{sat}_E)$ is transferred to the output of the output control gate as $L^{out}_E$, and a third state wherein $L^{in}_E$ is transferred to the output of the output control gate as $L^{out}_E$, such that the states of the output control gate are determined based on the control signal.

13. The TURBO-code decoding apparatus of claim 11, wherein the second path reliability saturation unit is comprised of:

a saturation memory unit configured to store the second saturated extrinsic symbol reliability value ($L^{sat}_E$);

a first adder gate configured to generate $2*(L^{sat}_E)$ and a negative reliability value from the second saturated extrinsic symbol reliability value $-(L^{sat}_E)$;

an input control gate having a first state wherein $-(L^{sat}_E)$ is transferred as a saturation output and a second state wherein $L^{sat}_E$ is transferred as the saturation output, such that the states of the input control gate are determined based on a sign bit of the second extrinsic symbol reliability value ($L^{in}_E$);

a path reliability memory unit configured to store ($L^{in}_E$);

a second adder gate configured to generate a control signal from an addition operation of $L^{in}_E$ and the saturation output; and an output control gate having a first state wherein $L^{sat}_E$ is transferred to an output of the output control gate as an output saturated extrinsic symbol reliability value ($L^{out}_E$), a second state wherein $-(L^{sat}_E)$ is transferred to the output of the output control gate as $L^{out}_E$, and a third state wherein $L^{in}_E$ is transferred to the output of the output control gate as $L^{out}_E$, such that the states of the output control gate are determined based on the control signal.

14. The TURBO-code decoding apparatus of claim 11, wherein the apparatus further includes:

a first path reliability saturation unit configured to saturate the first path reliability value received from the first SOVA decoder to generate a first saturated path reliability value as an input to the first decorrelation unit; and a second path reliability saturation unit configured to saturate the second path reliability value received from the second SOVA decoder to generate a second saturated path reliability value as an input to the second decorrelation unit and the second de-interleaver.

15. The TURBO-code decoding apparatus of claim 14, wherein the first path reliability saturation unit is comprised of:

a saturation memory unit configured to store the first saturated path reliability value $\Delta_{sat}$;

a first adder gate configured to generate $2*(\Delta_{sat})$;

an input control gate having a first state wherein $\Delta_{sat}$ is transferred as a saturation output and a second state wherein $2*(\Delta_{sat})$ is transferred as the saturation output, such that the states of the input control gate are determined based on a sign bit of the first path reliability value $(\Delta_{in})$;

a path reliability memory unit configured to store $\Delta_{in}$;

a second adder gate configured to generate a control signal from an addition operation of $\Delta_{in}$ and the saturation output;

a third adder gate configured to generate a negative reliability value from the first path reliability value $-(\Delta_{in})$; and an output control gate having a first state wherein $\Delta_{sat}$ is transferred to an output of the output control gate as an output saturated path reliability value $(\Delta_{out})$, a second state wherein $-(\Delta_{in})$ is transferred to the output of the output control gate as $\Delta_{out}$, and a third state wherein $\Delta_{in}$ is transferred to the output of the output control gate as $\Delta_{out}$, such that the states of the output control gate are determined based on the control signal.

16. The TURBO-code decoding apparatus of claim 14, wherein the second path reliability saturation unit is comprised of:

a saturation memory unit configured to store the second saturated path reliability value $\Delta_{sat}$;

a first adder gate configured to generate $2*(\Delta_{sat})$;

an input control gate having a first state wherein $\Delta_{sat}$ is transferred as a saturation output and a second state wherein $2*(\Delta_{sat})$ is transferred as the saturation output, such that the states of the input control gate are determined based on a sign bit of the second path reliability value $(\Delta_{in})$;

a path reliability memory unit configured to store $\Delta_{in}$;

a second adder gate configured to generate a control signal from an addition operation of $\Delta_{in}$ and the saturation output;

a third adder gate configured to generate a negative reliability value from the second path reliability value $-(\Delta_{in})$; and an output control gate having a first state wherein $\Delta_{sat}$ is transferred to an output of the output control gate as an output saturated path reliability value $(\Delta_{out})$, a second state wherein $-(\Delta_{in})$ is transferred to the output of the output control gate as $\Delta_{out}$, and a third state wherein $\Delta_{in}$ is transferred to the output of the output control gate as $\Delta_{out}$, such that the states of the output control gate are determined based on the control signal.

17. The TURBO-code decoding apparatus of claim 11, wherein:

the first interleaver stores a four most significant bits (MSB) of the first saturated symbol reliability value comprised of five bits, interleaves the four bit first saturated symbol reliability to generate a four bit second a prior value, such that the MBS of the four bit a priori value is used as a fifth least significant bit (LSB) to generate the second a priori value, the first de-interleaver stores a four MSB of the second saturated reliability value comprised of five bits, de-interleaves the four bit second saturated path symbol reliability to generate a four bit first a prior value, such that a MSB of the four bit a priori value is used as a fifth LSB to generate the second a priori value, and the second de-interleaver stores a four MSB of the second saturated path reliability value comprised of five bits, de-interleaves the four bit second saturated path symbol reliability to generate a four bit soft output, such that a MSB of the four bit soft output is used as a fifth LSB to generate the decoded message.

* * * * *